US007010194B2

(12) United States Patent
Anikitchev et al.

(10) Patent No.: US 7,010,194 B2
(45) Date of Patent: Mar. 7, 2006

(54) METHOD AND APPARATUS FOR COUPLING RADIATION FROM A STACK OF DIODE-LASER BARS INTO A SINGLE-CORE OPTICAL FIBER

(75) Inventors: Serguei G. Anikitchev, Belmont, CA (US); Mathew N. Rekow, Santa Cruz, CA (US)

(73) Assignee: Coherent, Inc., Santa Clara, CA (US)

( * ) Notice: Subject to any disclaimer, the term of this patent is extended or adjusted under 35 U.S.C. 154(b) by 478 days.

(21) Appl. No.: 10/266,066

(22) Filed: Oct. 7, 2002

(65) Prior Publication Data

US 2004/0067016 A1   Apr. 8, 2004

(51) Int. Cl.
    G02B 6/34    (2006.01)
(52) U.S. Cl. .......................................... 385/36; 385/33
(58) Field of Classification Search .................. 385/36, 385/15, 31, 33, 100, 111
    See application file for complete search history.

(56) References Cited

U.S. PATENT DOCUMENTS

| 4,978,197 | A |   | 12/1990 | Horikawa ..................... 350/174 |
|---|---|---|---|---|
| 5,155,623 | A |   | 10/1992 | Miller et al. .................. 359/495 |
| 5,258,989 | A |   | 11/1993 | Raven ........................... 372/6 |
| 5,513,201 | A |   | 4/1996 | Yamaguchi et al. ........... 372/75 |
| 5,650,873 | A |   | 7/1997 | Gal et al. ..................... 359/487 |
| 5,798,877 | A |   | 8/1998 | Nightingale et al. ......... 359/831 |
| 5,946,130 | A |   | 8/1999 | Rice ............................ 359/349 |
| 6,005,717 | A | * | 12/1999 | Neuberger et al. ........... 359/619 |
| 6,064,528 | A |   | 5/2000 | Simpson, Jr. ................. 359/619 |
| 6,151,342 | A |   | 11/2000 | Nightingale et al. .......... 372/36 |
| 6,175,452 | B1 |   | 1/2001 | Ullmann et al. .............. 359/641 |
| 6,212,216 | B1 |   | 4/2001 | Pillai ............................ 372/96 |
| 6,229,831 | B1 |   | 5/2001 | Nightingale et al. .......... 372/36 |
| 6,337,873 | B1 |   | 1/2002 | Goering et al. ................ 372/69 |
| 6,356,577 | B1 |   | 3/2002 | Miller .......................... 372/107 |

(Continued)

FOREIGN PATENT DOCUMENTS

DE    200 10 309 U1    6/2000

(Continued)

OTHER PUBLICATIONS

J.D. Minelly et al., "Diode-Array Pumping of $Er^{3+}/Yb^{3+}$ Co-Doped Fiber Lasers and Amplifiers," *IEEE Photonics Technology Letters*, vol. 5, No. 3, Mar. 1993, pp. 301-303.

(Continued)

*Primary Examiner*—Daniel Stcyr
(74) *Attorney, Agent, or Firm*—Stallman & Pollock LLP

(57) ABSTRACT

A method of coupling laser-radiation into an optical fiber includes providing a stack of diode-laser bars and first and second parallel mirrors, the second mirror is selectively reflective only for one polarization plane of the laser-radiation. Each of the diode-laser bars includes at least two spaced-apart diode-laser emitters each emitting a plane-polarized beam of laser-radiation having a fast axis and a slow axis. The laser-radiation beams are collimated in the fast axis by a cylindrical lens located in front of each bar. In one arrangement the polarization orientation of one collimated beam from each diode-laser is rotated by 90 degrees and transmitted through the selectively-reflective mirror. The other collimated beam from each diode-laser bar is reflected onto the selectively-reflective mirror by the first mirror and reflected from the selectively-reflective mirror such that the reflected beam combines with the transmitted beam to form a combined beam. As many combined beams are formed as there are diode-laser bars in the stack. These combined beams are focused into an entrance face of the optical fiber.

57 Claims, 8 Drawing Sheets

U.S. PATENT DOCUMENTS

| | | | |
|---|---|---|---|
| 6,411,323 B1 * | 6/2002 | Waarts et al. | 347/241 |
| 6,556,352 B1 * | 4/2003 | Wang et al. | 359/641 |
| 6,680,800 B1 | 1/2004 | Schreiber et al. | 359/618 |
| 6,683,727 B1 | 1/2004 | Göring et al. | 359/639 |
| 6,785,440 B1 * | 8/2004 | Lawrenz-Stolz | 385/33 |
| 6,851,610 B1 | 2/2005 | Knowles et al. | 235/462.01 |
| 2004/0067016 A1 | 4/2004 | Anikitchev et al. | 385/34 |
| 2004/0091013 A1 * | 5/2004 | Yamaguchi et al. | 372/108 |
| 2004/0091209 A1 | 5/2004 | Mikhailov | 385/31 |

FOREIGN PATENT DOCUMENTS

| | | |
|---|---|---|
| DE | 101 13 019 A1 | 3/2001 |
| EP | 0 984 312 A2 | 8/1999 |
| EP | 1 143 584 A2 | 10/2001 |
| JP | 2002-148562 | 5/2002 |
| WO | WO 99/35724 | 7/1999 |
| WO | WO 00/57229 | 9/2000 |
| WO | WO 00/60399 | 10/2000 |
| WO | WO 01/27686 A1 | 4/2001 |

OTHER PUBLICATIONS

"Uniform Line Illumination with Small Area High Radiant Sources," *IBM Technical Disclosure Bulletin*, vol. 35, No. 3, Aug. 1992, 2 pages in length.

* cited by examiner

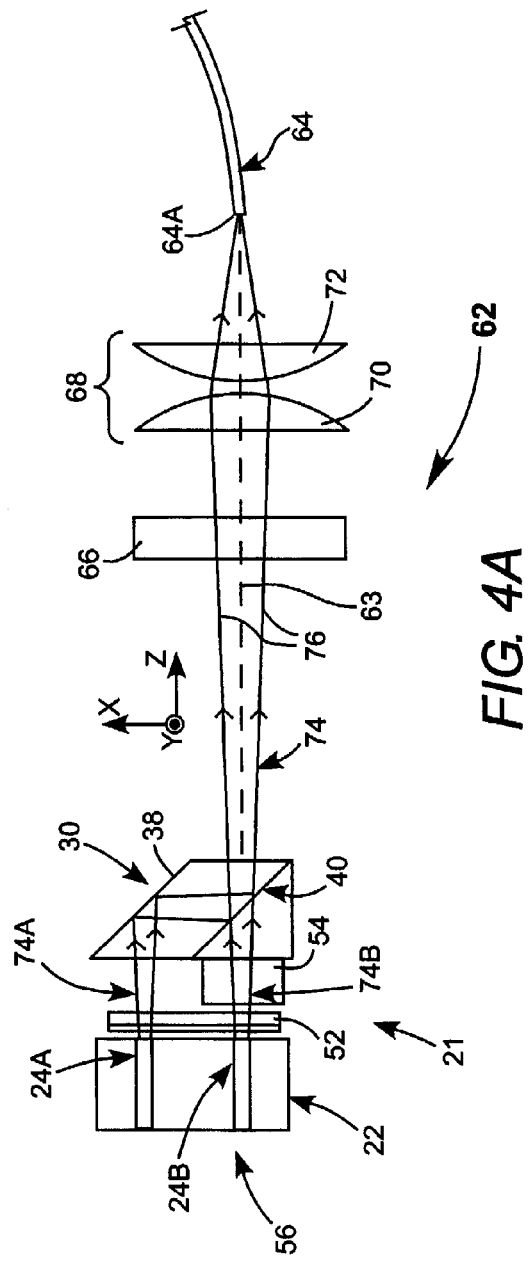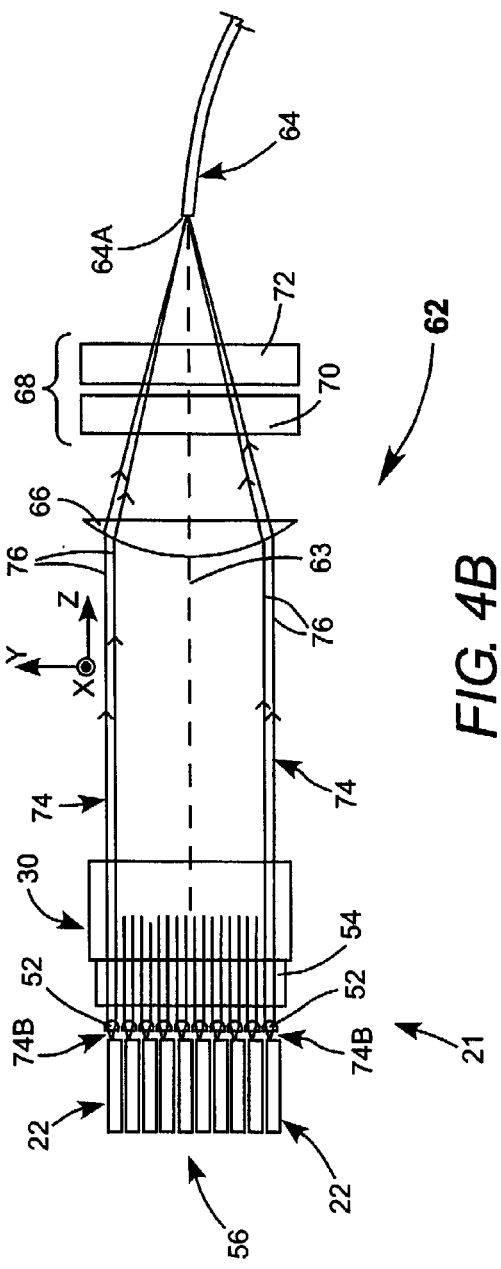

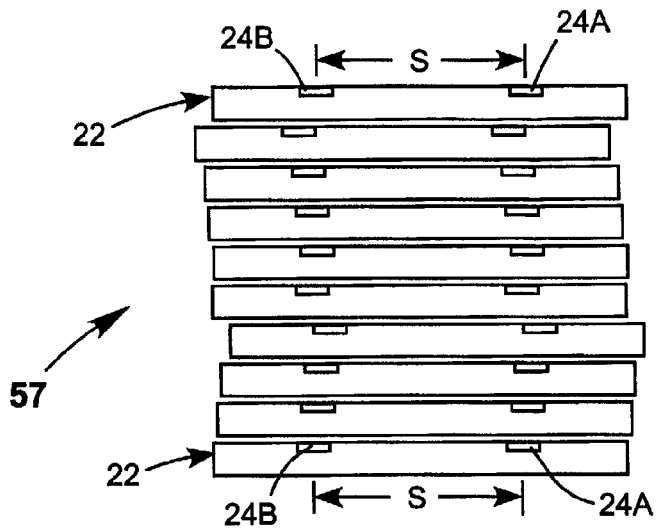
FIG. 7
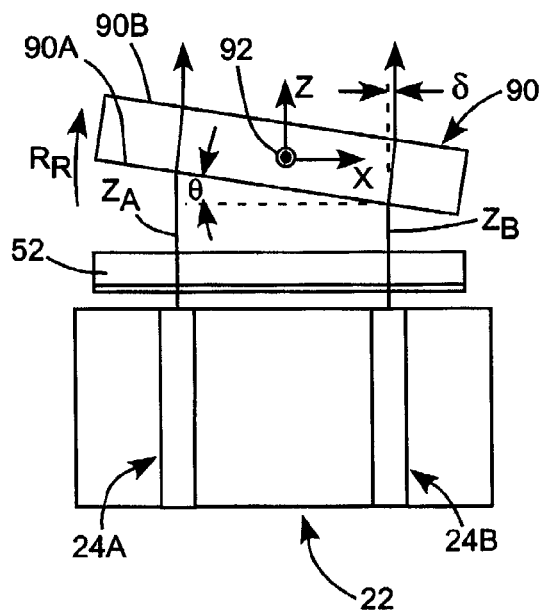 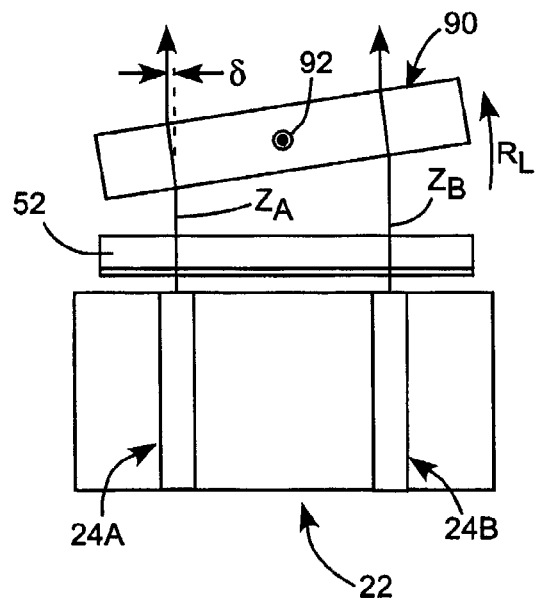
FIG. 8A          FIG. 8B

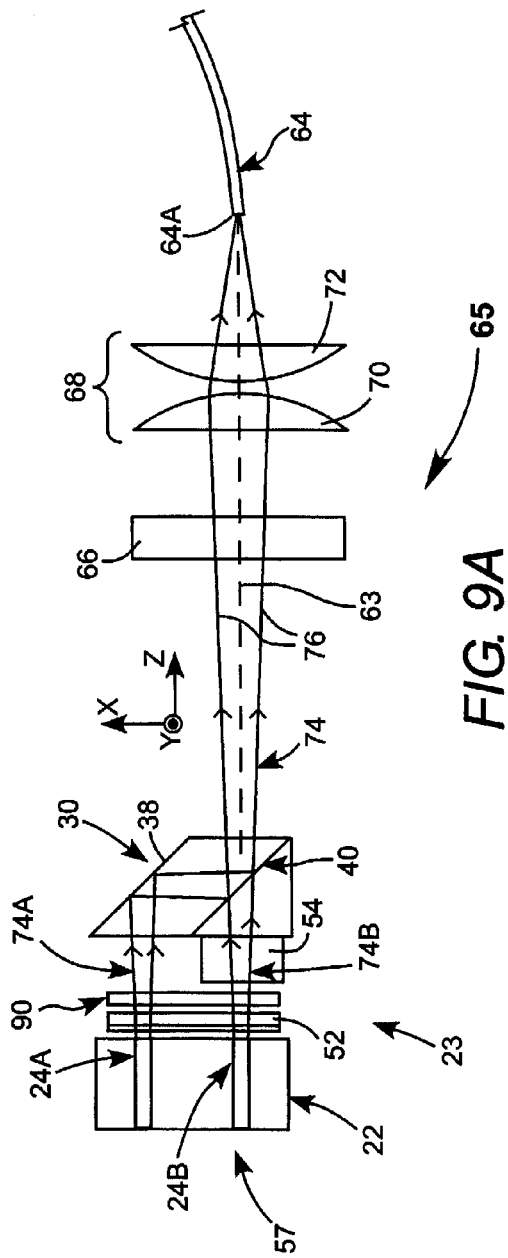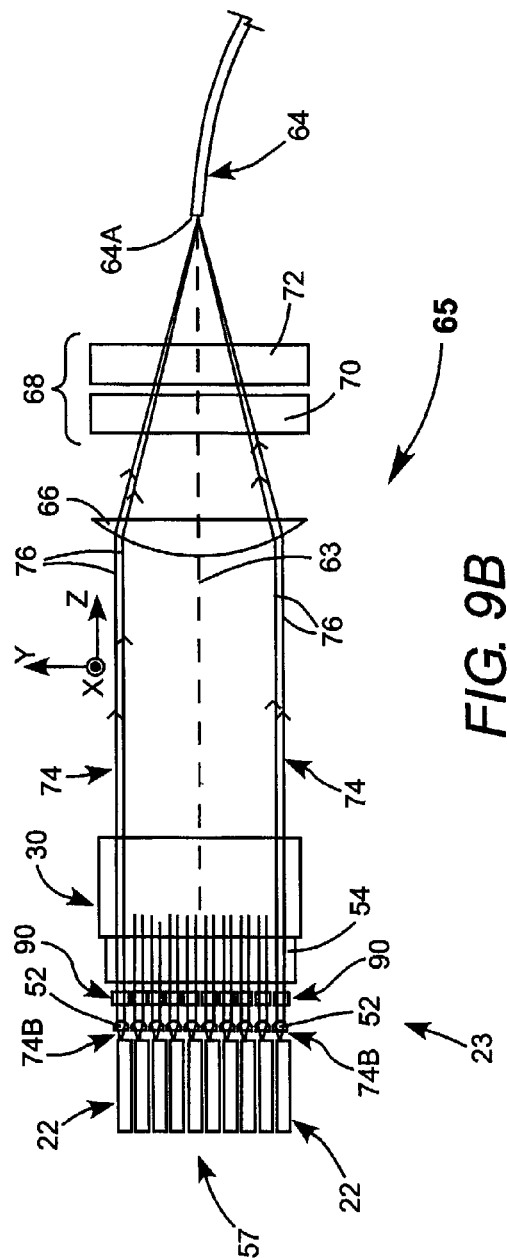

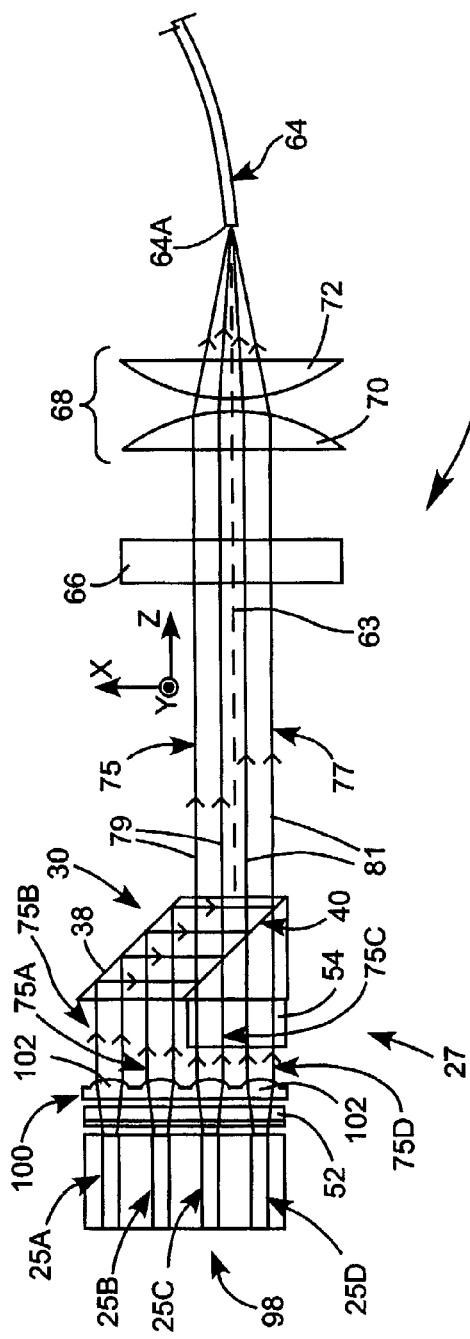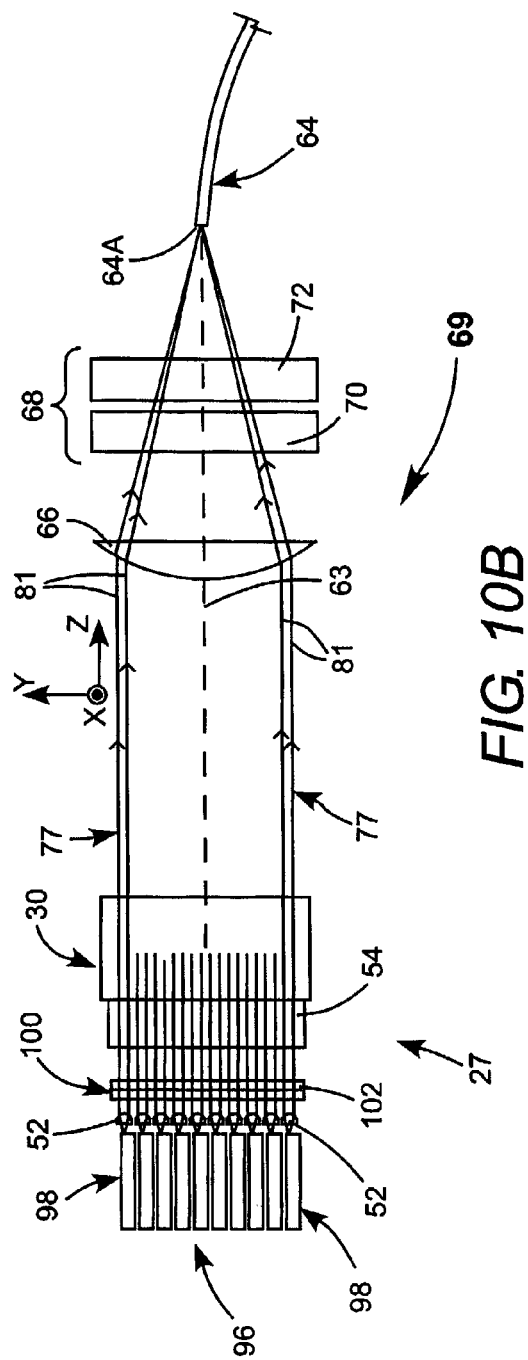
FIG. 10A
FIG. 10B

METHOD AND APPARATUS FOR COUPLING RADIATION FROM A STACK OF DIODE-LASER BARS INTO A SINGLE-CORE OPTICAL FIBER

TECHNICAL FIELD OF THE INVENTION

The present invention relates generally to coupling laser-radiation from two-dimensional diode-laser arrays into a single-core optical fiber. The invention relates in particular to coupling radiation from a stack of two-emitter diode-laser bars by combining beams from each emitter to form plurality of parallel beams aligned in the fast axis of the diode-laser bars and focusing the plurality of beams into the single-core optical fiber.

DISCUSSION OF BACKGROUND ART

Laser-radiation from diode-laser arrays is frequently used for optically pumping solid-state lasers. The diode-laser array may be a one-dimensional (linear) array or a two-dimensional array. Typically, a one-dimensional array of diode-lasers is made by forming a plurality of diode-lasers (emitters) in a common substrate. This is commonly referred to as a diode-laser bar. A plurality of such bars can be stacked to form a two-dimensional diode-laser array.

In a solid state-laser, the gain medium is a crystal or rod of a solid-state material, such as neodymium-doped yttrium-aluminum garnet (Nd:YAG), and the diode-laser array is often remotely located from the gain medium. In such a laser, it is usual to couple radiation from the diode-laser array into an optical fiber and deliver the radiation via the optical fiber to a location proximate the gain medium. If the solid-state laser is an optical-fiber laser, the radiation is coupled directly into the optical-fiber laser.

Typically, a diode-laser bar for providing laser-radiation having a wavelength of between about 800 and 1000 nanometers (nm) is about 10 millimeters (mm) long, about 1 mm wide and may include between about 19 and 40 individual emitters, spaced-apart along the diode-laser bar. The emitters have a rectangular emitting-aperture about 1 micrometer ($\mu$m) high and between about 50 $\mu$m and 100 $\mu$m wide. The emitters are arranged with their emitting-apertures aligned in the width direction of the emitters, which is in the length direction of the diode-laser bar.

Each emitter emits a laser-radiation beam that diverges slowly in the width direction or slow-axis of the emitting-aperture and diverges quickly in a fast axis perpendicular to the slow axis, i.e., in the height direction of the emitting-aperture. Slow-axis divergence is usually between about 3 and 6 degrees (half-angle) and fast-axis divergence is usually between about 25 and 40 degrees (half-angle).

It is common practice to provide a diode-laser bar with a cylindrical microlens having a length about equal to the length of the diode-laser bar, and aligned with the width direction of the emitters. The term "cylindrical" here, means that the lens has optical power in only one transverse axis thereof, here, the fast axis. Optical power in is selected to collimate the beams from all of the individual emitters in the fast axis. In the fast axis, after passing through the cylindrical lens, the laser-radiation beams can be treated as a single, high-quality (low-divergence) beam and can be precisely focused in this axis. In the slow axis, however, the beams collectively have a poor beam-quality that is magnified by the number of emitters in the bar and the spacing between the emitters. Focusing in the slow axis is correspondingly imprecise. There is a need to improve the collective slow-axis beam quality from a multi-emitter diode-laser bar.

SUMMARY OF THE INVENTION

The present invention is directed to a method of coupling laser-radiation into an optical fiber or focusing the laser radiation onto a workpiece. In one aspect, the method comprises providing a plurality N of diode-laser bars, each of the diode-laser bars including a plurality of spaced-apart diode-laser emitters, each thereof emitting a beam of laser-radiation. One plurality of the laser-radiation beams is combined with a separate second plurality of the laser-radiation beams to form a third plurality of combined laser-radiation beams. Each of the combined laser-radiation beams includes co-propagating ones of the first and second pluralities of laser-radiation beams from a corresponding diode-laser bar. The third plurality of laser-radiation beams is focused into an entrance face of the optical fiber.

In a preferred embodiment of the inventive method, each of the diode-laser bars includes first and second spaced-apart diode-laser emitters emitting respectively first and second beams of laser-radiation. The laser-radiation beams are plane-polarized with the polarization orientation being in the fast axis. Each of the emitters has an emitting-aperture from which the laser-radiation beam is emitted. Each emitting-aperture has a height and a width, and the emitting-apertures are aligned with each other in the width direction. The emitted laser-radiation beam from each emitting-aperture diverges unequally in fast and slow axes perpendicular to each other and mutually perpendicular to the general direction of emission. The fast axis is perpendicular to the width direction, i.e., parallel to the height direction of the emitters. The diode-laser bars are arranged one above the other in the fast-axis direction. Prior to the optical combining step, the emitted laser-radiation beams are collimated in the fast-axis.

An optical arrangement for combining the beams includes a composite prism. The composite prism includes a parallelepiped prism having one face thereof bonded to a face of a triangular prism. Another face of the parallelepiped prism, parallel to the bonded face thereof, provides a first mirror highly reflective for laser-radiation having the fast-axis polarization orientation of the emitted laser-radiation beams. One of the bonded faces of the parallelepiped and triangular prisms is coated such that the bonded faces thereof form a mirror highly reflective for laser-radiation having the fast-axis polarization and highly transmissive for laser-radiation having a polarization orientation perpendicular to the fast axis, i.e., in the slow axis.

In combining the beams, the fast-axis collimated second laser-radiation beams are each passed through a polarization-rotating device that rotates the polarization orientation of the beams from the fast axis to the slow axis. The fast-axis collimated polarization-rotated beams are transmitted through the second mirror. The collimated first laser-radiation beams are sequentially reflected from the first and second mirrors such that N combined laser-radiation beams are formed. Each of the combined laser-radiation beams includes co-propagating ones of the fast-axis collimated, sequentially reflected first, and fast-axis collimated, transmitted, polarization-rotated second laser-radiation beams from a corresponding diode-laser bar. The combined laser-radiation beams are parallel to each other and aligned in the fast axis direction.

The method of the present invention is also applicable to diode-laser bars in emitted laser-radiation is plane-polarized in the slow axis. In this case, in combining the beams, the fast-axis collimated first laser radiation beams are each passed through a polarization-rotating device that rotates the polarization orientation of the beams from the slow axis to fast axis. The fast-axis collimated second laser-radiation beams are transmitted through the second mirror. The fast-axis collimated, polarization-rotated first laser-radiation beams are sequentially reflected from the first and second mirrors such that N combined laser-radiation beams are formed. Each of the combined laser-radiation beams includes co-propagating ones of the fast-axis collimated, transmitted second, and fast-axis collimated, polarization-rotated sequentially-reflected first laser-radiation beams from a corresponding diode-laser bar. The combined laser-radiation beams are parallel to each other and aligned in the fast axis direction.

An optical arrangement for focusing the combined laser-radiation beams into the optical fiber includes a lens having positive optical power in the fast axis and zero optical power in the slow axis, and another lens having positive optical power in the slow axis and zero optical power in the fast axis. Alignment of the combined beams may be effected by arranging and aligning the diode-laser bars such that each of the first and second emitters are aligned in the fast axis direction. In a case where the emitters can not be accurately so aligned, an alignment plate may be provided for each diode-laser bar. The alignment plate is disposed between the diode-laser bar and the composite prism and is rotatable about the fast-axis direction for laterally displacing the path of the emitted beams in the slow-axis direction. Providing such alignment plates allows the fast-axis collimated and combined beams to be accurately aligned even if emitters are misaligned.

The preferred embodiment of the inventive beam combination method has an advantage that by selecting appropriate values for emitter-spacing and emitter width in the two emitter diode-laser bars, the beam quality of combined beams from a plurality of emitters can have the same slow-axis beam quality as a single emitter. By selecting appropriate values for the number and fast-axis spacing of the diode-laser bars the beam quality of laser-radiation in the combined beams can be made equal in the fast and slow axes for optimizing coupling into a circular-core optical fiber. Those skilled in the art will recognize other advantages and embodiments of the invention from the detailed description presented hereinbelow.

BRIEF DESCRIPTION OF THE DRAWINGS

The accompanying drawings, which are incorporated in and constitute a part of the specification, schematically illustrate a preferred embodiment of the present invention, and together with the general description given above and the detailed description of the preferred embodiment given below, serve to explain the principles of the present invention.

FIGS. 4A and 4B are respectively plan and elevation views schematically illustrating one embodiment of an optical arrangement in accordance with the present invention for focusing the ten beams of the combining apparatus of FIG. 3 into an entrance face of an optical fiber.

FIG. 7 schematically illustrates a diode-laser bar stack similar to the diode-laser bar stack of FIG. 3, but with diode-laser bars and corresponding emitters thereof misaligned in the slow axis direction.

FIGS. 8A and 8B schematically illustrate a diode-laser-bar in the diode-laser bar stack of FIG. 7 and an alignment plate rotatable about the fast axis direction for displacing the beam path from the emitters in the slow axis direction to correct for misalignment of the emitters with those of any other diode-laser bar in the stack.

FIGS. 9A and 9B are respectively plan and elevation views schematically illustrating an optical arrangement similar to the optical arrangement of FIGS. 4A and 4B, but wherein the diode-laser bar stack of the beam combining apparatus includes misaligned diode-laser bars and the alignment plate of FIGS. 8A and 8B is provided for each diode-laser bar to correct for the misalignment of the emitters.

FIGS. 10A and 10B schematically illustrate another embodiment of apparatus in accordance with the present invention including beam combining apparatus in accordance with the present invention having a stack of ten four-emitter diode-laser bars, a polarization rotator and a composite prism for combining laser-radiation beams from the forty emitters into twenty beams propagating parallel to each other, and an optical arrangement for focusing the twenty combined beams into an entrance face of an optical fiber.

DETAILED DESCRIPTION OF THE INVENTION

Figure 1:
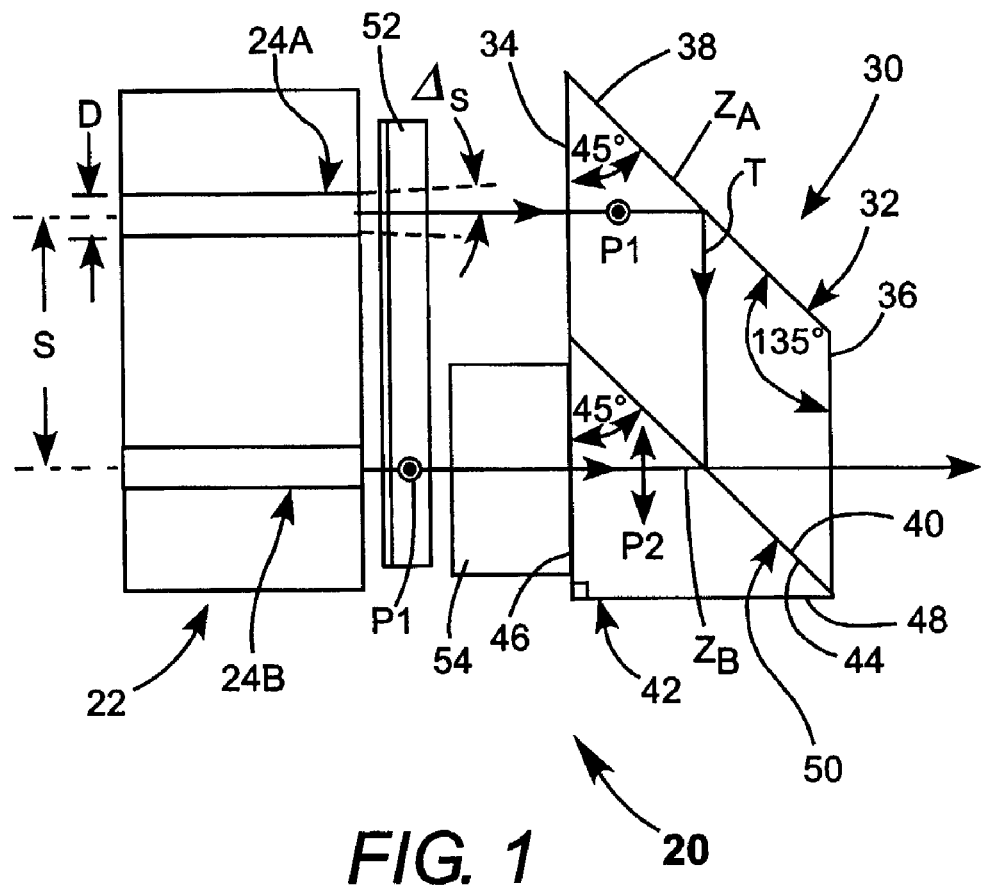
FIG. 1 is a plan view schematically illustrating a preferred embodiment of diode-laser radiation beam combining apparatus in accordance with the present invention including a two-emitter diode-laser bar emitting laser radiation plane-polarized parallel to the fast axis of the diode laser bar, and an optical arrangement including a polarization rotator and a composite prism for combining laser-radiation beams from the two emitters.
Figure 2:
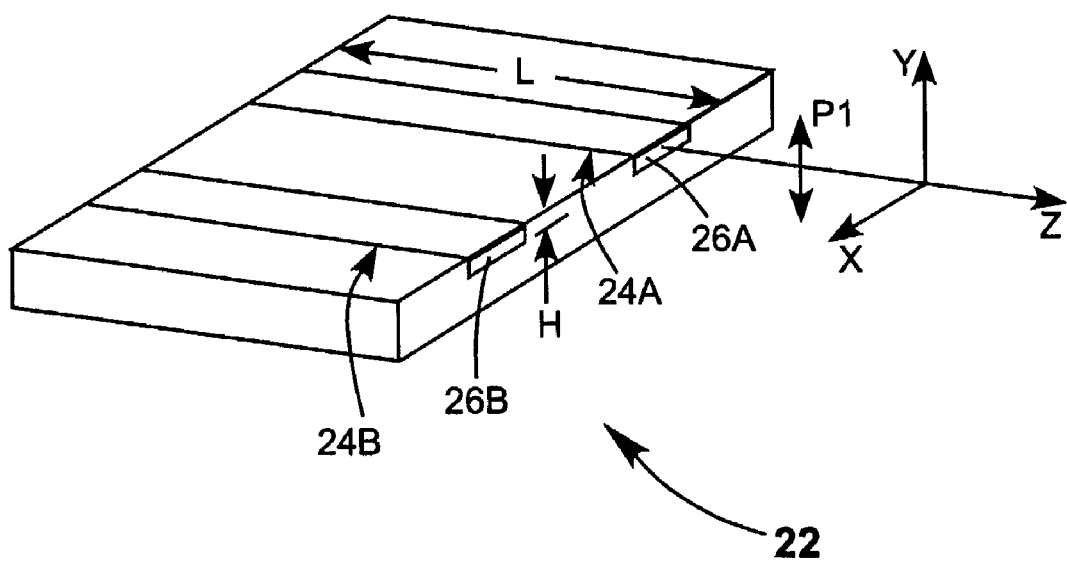
FIG. 2 is a three-dimensional view schematically illustrating details of the diode-laser bar and emitters of FIG. 1.

Turning now to the drawings, wherein like features are designated by like reference numerals, FIG. 1 schematically illustrates a preferred embodiment 20 of beam combining apparatus in accordance with the present invention. Apparatus 22 includes a diode-laser bar or array having two emitters 24A and 24B. Referring additionally to FIG. 2, emitters 24A and 24B emit laser-radiation from emitting-apertures 26A and 24B respectively, each having a height H, and a with D. The emitters have a length L about equal the width of diode-laser bar 22. Emitters 24A and 24B are spaced apart center-to-center by a distance S. Height H is typically on the order of about 1.0 micrometers ($\mu$m). Width D is preferably between about 50 and 1000 $\mu$m. Emitters having a width in this range are often referred to by practitioners of the art as broad-area emitters, or broad-aperture emitters. Such emitters can deliver up to about 20 Watts (W) of power per emitter.

Each emitter 24 emits laser-radiation in the form of a diverging beam propagating generally along a propagation axis Z. The beam has a relatively slow divergence in an axis X perpendicular to axis Z and parallel to the width direction of emitting-apertures 26A and 26B, i.e., parallel to the length direction of the diode-laser bar. This axis is usually termed the slow axis of the emitter by practitioners of the art. The slow axis divergence is represented as a half-angle $\Delta_S$. This angle is dependent, inter alia, on the dimensions of the emitters and emitting-apertures and may be between about 3 and 6 degrees, i.e., between 50 and 100 milliradians (mrad) for broad-area emitters. The laser-radiation beam emitted from emitting-apertures 26A and 26B diverges in an axis Y, perpendicular to axes X and Z, with a half angle between about 25 and 40 degrees. Axis Y is usually termed the fast axis of the emitter by practitioners of the art.

Laser-radiation emitted by emitters 24 is plane-polarized with the electric field vector (polarization orientation) parallel to the fast axis (perpendicular to the slow-axis) as indicated in FIG. 2 by arrows P1. Apparatus 20 includes a composite prism 30 comprising a rectangular parallelepiped prism 32, having a pair of parallel faces 34 and 36 and a pair of parallel faces 38 and 40, and an isosceles-triangle prism 42 having a hypotenuse face 44 and isosceles faces 46 and 48. Parallelepiped prism 32 preferably has corner angles of 45° and 135°. Isosceles prism 42 preferably has corner angles of 90° and 45°.

Face 40 of prism 32 and face 44 of prism 42 are bonded together, with one of the faces being coated, prior to bonding, with a multilayer dielectric coating (not shown) arranged such that when the faces are bonded together they form a polarization sensitive mirror 50. Face 38 of prism 32 forms a mirror by virtue of total internal reflection (TIR). Faces 38, 40, and 44 (mirror 50) have their planes aligned parallel to the fast (Y) axis and inclined at 45° to the propagation (Z) axis.

Prism face (mirror) 38 and mirror 50 are highly reflective for radiation having the wavelength of the diode-laser-radiation and plane-polarized in orientation P1. Mirror 40 is highly transmissive for radiation having the wavelength of the diode-laser-radiation and plane-polarized in an orientation P2, perpendicular to orientation P1. In commercial practice, P1 reflection and P2 transmission greater than 98% is achievable for a mirror such as mirror 40. Care must be taken to minimize stresses in the prisms introduced by the manufacturing process, or in the bonding of the prisms to form mirror 36. Such stresses will adversely affect the values of reflection and transmission achievable.

Continuing with reference to FIGS. 1 and 2, laser-radiation from emitter 24B follows a path $Z_B$ parallel to propagation axis Z. A cylindrical lens 52 is provided for collimating the laser radiation in the fast axis. The term "cylindrical lens" as used herein means a lens having positive or negative optical power in one of the X and Y-axes and zero optical power in the other. Lens 52 has positive optical power in the Y-axis. After being fast-axis collimated, the radiation traverses a polarization-rotating device 54, such as a half-wave plate, which rotates the polarization orientation of the radiation from orientation P1 to orientation P2. Polarization rotating device 54 may be optically bonded to composite prism 30, as depicted in FIGS. 1 and 2, or may be a stand-alone device.

The polarization-rotated laser-radiation P2 enters prism 42 via isosceles face 46 thereof and is transmitted through polarization-selective mirror 50, continuing along path $Z_B$. Laser-radiation from emitter 24A follows a path $Z_A$ parallel to propagation axis Z. The laser-radiation enters prism 32 via face 34 thereof and is reflected from face 38 thereof along a path T perpendicular to the propagation axis. Path T is incident on polarization sensitive mirror 40 at a point at which path $Z_B$ traverses the mirror, and is reflected along path $Z_B$ combined with light emitted by emitter 24B to form a single beam.

The beam quality of the thus-combined beam is significantly greater than the beam quality of light emitted by the emitters as a separate pair. The slow-axis beam quality of radiation emitted by the emitters as a standard separate pair can be represented by an equation:

$$Q_S = [(S+2D)/2]\Delta_S \quad (1)$$

where S is the spacing between emitters and D is the emitter width as discussed above. The factor 2 is the number of emitters. For an emitter spacing of 6 millimeters (mm), a divergence of 17 milliradians (mrad) and an emitter width of 0.5 mm, $Q_S$ is about 250 mm*mrad. Combining the beams as described above effectively reduces spacing S to zero and the two emitters become effectively a single emitter. The "dead" space between emitters no longer affects the slow-axis beam quality. Accordingly, equation (1) becomes:

$$Q_S = D\Delta_S/2 \quad (2)$$

and the beam quality becomes 18 mm*mrad. This is almost a factor of 14 improvement in beam quality for the two-emitter diode-laser bar 22.

Those skilled in the art will recognize, without further illustration, that combination of the beam paths may be effected by replacing parallelepiped prism 32 with a front surface mirror at the location of face 38 of the parallelepiped prism, and by making mirror 40 the internal reflecting face of a polarizing beamsplitter cube. Use of composite prism 30 is preferred as it can be arranged such that beams from the two emitters follow about the same optical path length and accordingly, have about the same slow-axis width at the point of combination on mirror 50.

Figure 3:
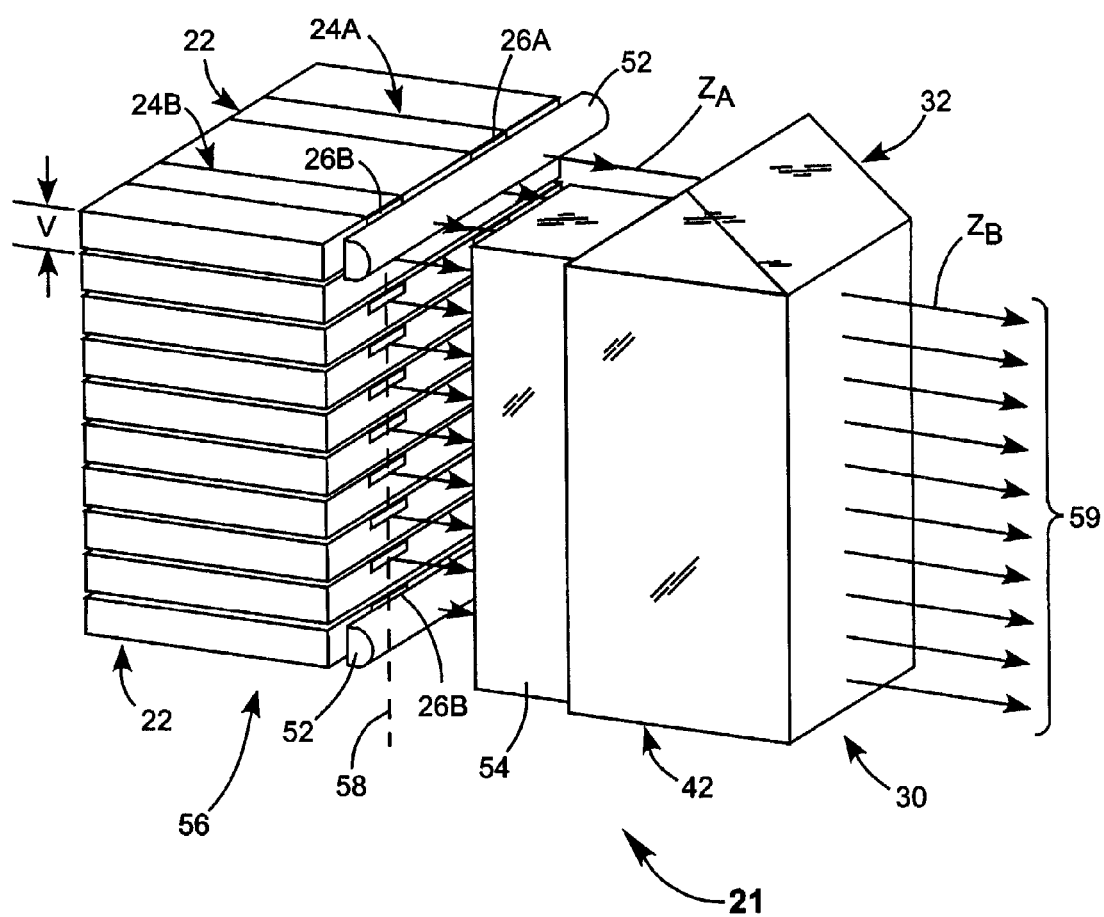
FIG. 3 is a three-dimensional view schematically illustrating another embodiment of diode-laser radiation beam combining apparatus in accordance with the present invention, a stack of ten two-emitter diode-laser bars and an optical arrangement including a polarization rotator and a composite prism for combining laser-radiation beams from the twenty emitters into ten beams aligned and propagating parallel to each other.

FIG. 3 schematically illustrates another embodiment 21 of beam combining apparatus in accordance with the present invention. Here a stack 56 of ten two-emitter diode-laser bars 22 is arranged with corresponding emitters 24A and 24B of the diode-laser bars aligned, one above the other, in the fast-axis direction, as indicated (for emitters 24B) by dashed line 58. Corresponding emitters of adjacent diode-laser bars 22 are spaced apart center-to-center in the fast-axis direction by a distance V. Preferably, emitters 24A (and correspondingly 24B) should not be misaligned in the by more than about one-tenth of the emitter width. Emitter spacing V should be kept as small as possible, but a minimum value will be determined practically by cooling arrangements (not shown) for the diode-laser bars, and by the thickness of the diode-laser bars.

The number of diode-laser bars in stack 56 should not be construed as limiting the present invention. A discussion of the significance of the number of diode-laser bars in a stack, and the spacing V of those bars, is presented hereinbelow with reference to a particular application of the inventive beam combining apparatus.

Composite prism 30 combines beams (only one axial ray shown for each beam) from emitters 24A and 24B of each diode-laser bar to provide a group 59 of ten combined beams, parallel to the propagation axis and aligned in the fast axis. Before being combined, the beams are collimated by cylindrical lenses 52. One lens 52 is provided for each diode-laser bar 22, however, only two are shown in FIG. 3 for simplicity of illustration.

FIG. 4A and FIG. 4B schematically illustrate an optical system 62 illustrating beam combining apparatus 21 in accordance with the present invention having a stack of ten diode-laser bars 22. Optical system 62 is arranged to focus radiation delivered by diode-laser bars 22 into an optical fiber 64. The optical system includes a single-element cylindrical lens 66 having positive optical power in the Y axis and a cylindrical lens 68 including two cylindrical lens elements 70 and 72, each having positive optical power in the X axis. Lenses 66 and 68 are located on an optical system axis 63.

Beams 74A and 74B are collimated in the fast axis by cylindrical lenses 52. Composite prism 30 combines beams 74A and 74B from each diode-laser bar 22 in the slow axis. This results in ten beams 74 being delivered from composite prism 30. Beams 74 propagate parallel to each other and aligned with each other in the fast axis. (see FIG. 4B). Only two of these parallel beams are depicted in FIG. 4B for simplicity of illustration. Rays 76 of beams 74, diverging in the slow axis, are focused into entrance face 64A of optical fiber 64 by cylindrical lens 68. Rays 76 are parallel in the fast axis and are focused into entrance face 64A of A single-core optical fiber 64 by cylindrical lens 66. Entrance face 64A is centered on the optical system axis 63. Optical fiber 64 may be a fiber used to transport the laser-radiation to another location or may an optical fiber of a material doped to provide a laser gain-medium excitable by the laser-radiation.

It is believed, without being limited to a particular hypothesis, that optimal coupling (focusing) of radiation from diode-laser bars 22 into optical fiber 64 occurs when the beam quality of beams 74 is the same in the fast axis and in the slow axis. Based on this hypothesis, for a given total power delivered by diode-lasers 22, it is possible to determine for optical system 62 an optimum number N of diode-laser bars 22, an optimum width D of emitters 26, and an optimum (core) diameter of optical fiber 64, for a given fast-axis emitter-spacing V and a given numerical aperture (NA) of optical fiber 64, such that radiation can be optimally coupled into the optical fiber. Beam quality $Q_S$ in the slow axis is given by equation (2) above. Collective beam quality $Q_F$ in the fast axis is given by an equation:

$$Q_F = N V \Delta_F / 2 \qquad (3)$$

where $\Delta_F$ (mrad) is the "post collimation" half-angle divergence each beam in the fast-axis direction and is normally determined by quality and alignment of collimating lens 52 and other optical elements in the beam path.

As only two emitters are included in each of diode-laser bars 22, some degree of misalignment of emitters 24A and 24B in any diode-laser bar in the fast-axis direction is tolerable, as it can be essentially compensated by suitable alignment of lens 52. Accordingly such misalignment does not significantly affect the quality of collimation achievable by lens 52. Such fast-axis misalignment of emitters in a multi-emitter diode-laser bar (whimsically referred to by practitioners of the art as "smile") results from the manufacturing process. In such a bar, this "smile" presents problems in attempting to collimate fast-axis output of emitters with a single lens. The two-emitter bar of the present invention effectively avoids such problems.

The total power P delivered by diode-lasers 22 may be defined by an equation:

$$P = 2DN\eta \qquad (4)$$

where $\eta$ (in units of Watts/mm) is a proportionality coefficient between the width D of an emitter and its output power. The following equations for optimum values of D and N can be derived from equations (1) through (4):

$$D = [(VP\Delta_F)/(2\eta\Delta_S)]^{0.5} \qquad (5)$$

$$N = [(P\Delta_S)/(2\eta V\Delta_F)]^{0.5} \qquad (6)$$

Equating $Q_S$ and $Q_F$ using the values of equations (5) and (6) yields an equation:

$$Q_S = Q_F = [(PV\Delta_S\Delta_F)/(8\eta)]^{0.5} \qquad (7)$$

For an optical fiber 64 having a numerical aperture $\alpha$, an optimum fiber (core) diameter F can be defined by an equation:

$$F = 1.1[(PV\Delta_S\Delta_F)/\eta]^{0.5}1/\alpha \qquad (8)$$

where F is in units of millimeters, and the multiplier 1.1 is introduced to account for practical alignment tolerances in coupling radiation into the optical fiber. The numerical aperture of an optical fiber is the sine of the maximum angle of incidence of radiation that the entrance face of the optical fiber will accept. The effectiveness of coupling radiation into an optical fiber is then dependent on the amount of incident radiation that can be packed into a cone having that angle. This is termed the brightness of the radiation and is usually characterized in Watts per steradian. The brightness B delivered by an optical fiber having a core diameter F and a numerical aperture $\alpha$ can be defined by an equation:

$$B = P_F/[\pi^2(F\alpha/2)^2] \qquad (9)$$

where $P_F$ is the power carried by the optical fiber. For 100% coupling of power into the optical fiber, the power coupled into the fiber equates to the power delivered by the fiber, i.e., power P of equation (8) equates to power $P_F$ of equation (9). If the fiber diameter F is optimized in accordance with the present invention, as defined by equation (8), then equation (9) transforms to:

$$B = 4\eta/(1.21\Delta_S\Delta_F V) \qquad (10)$$

From equation (10) it can be seen that the brightness of radiation delivered by optical apparatus in accordance with the present invention is independent of the total power delivered by the apparatus. The brightness depends directly on $\eta$, the power delivered by an emitter per unit emitting-aperture width, and inversely on the fast and slow axis divergence of the emitter and the fast-axis spacing of emitters in the stack of diode-laser bars. For a practical case, where coupling may be less than 100% efficient, because of factors including reflection loss at the optical fiber entrance face 64A (see FIGS. 4A and 4B), less-than-perfect alignment of the optical fiber entrance face with the optical axis 63 of the inventive optical system, and aging of an emitter, equation (10) becomes:

$$B = 4\eta/(1.21\Delta_S \Delta_F V\beta) \tag{11}$$

where $\beta$ is a number, greater than 1.0, but usually less than 2.0, representing the total of such factors. As none of the factors contributing to $\beta$ is dependent on total power, the brightness defined by equation (11) is also not dependent on total power.

One important factor influencing the brightness achievable in an apparatus in accordance with the present invention is the slow-axis divergence $\Delta_S$. This factor is directly dependent to some degree on the width of the emitter, which, for any given value of $\eta$ must be increased to increase the power delivered by the emitter. Accordingly there is a possibility that increasing emitter power by increasing emitter width can increase $\Delta_S$ to a degree where brightness decreases. $\Delta_S$ discussed above, the width of emitters commonly employed in commercially available, high-power, (about 40 Watts total or greater) diode-laser bars is between about 50 and 200 $\mu$m. Such emitters are generally termed broad-area emitters by practitioners of the art. A description of one method of increasing emitter power in an apparatus in accordance with the present invention while maintaining or reducing $\Delta_S$, or of decreasing $\Delta_S$ for a given emitter power, is set forth below with reference to FIG. 5 and FIG. 6, and with reference again to FIGS. 1, 2 and 4.

Figure 5:
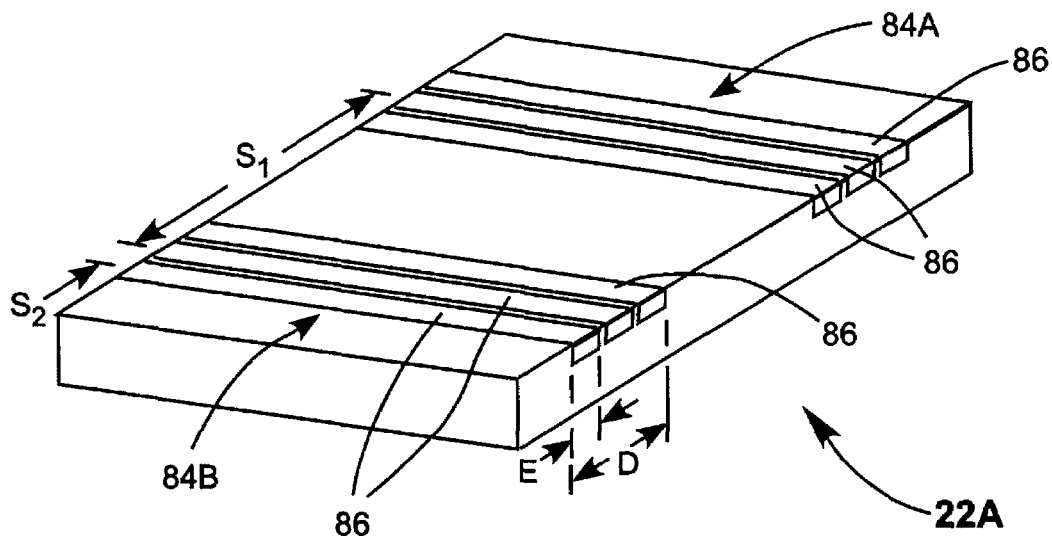
FIG. 5 schematically illustrates a diode-laser bar in accordance with the present invention including two spaced-apart clusters of three narrow emitters, each cluster for simulating a single broad emitter in a two-emitter diode-laser bar in the apparatus of FIG. 1.
Figure 6:
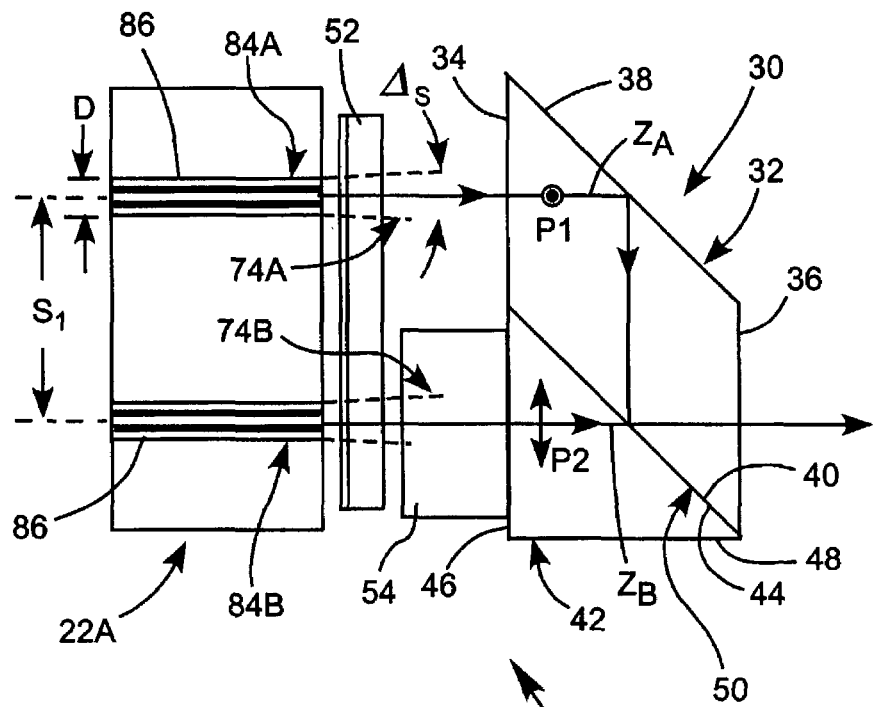
FIG. 6 schematically illustrates a beam combining apparatus similar to the beam combining apparatus of FIG. 1, but wherein the diode-laser bar includes the two spaced-apart clusters of narrow emitters of FIG. 5.

FIG. 5 schematically illustrates a diode-laser bar 82 in accordance with the present invention, in which broad area emitters 24A and 24B of diode-laser bar 22 having a width D (see FIG. 1) are replaced by spaced-apart clusters 84A and 84B of narrow-area (narrow aperture) emitters 86. These narrow area emitters preferably have an aperture width between about 10 and 50 $\mu$m. These narrow-aperture emitters 86 are referred to alternatively herein after as "sub-emitters" to distinguish them from the broad-area emitters described above. The width across the clusters is D and each sub-emitter has a width $D_S$.

Clusters 84A and 84B are spaced apart by a distance $S_1$, and sub-emitters 86 are spaced apart within the clusters by a distance $S_2$. The packing of sub-emitters in the clusters can be characterized by a "fill factor" usually defined by practitioners of the art as the ratio of $D_S:S_2$ expressed as a percentage. In clusters 86A and 86B this fill factor should be greater than 50%, i.e., S2 should be less than two sub-emitter widths. The fill factor is preferably greater than 80%. Spacing $S_2$ is preferably greater than about 2D, i.e., greater than about two cluster widths. Under these conditions, clusters 86A and 86B (see FIG. 6) will approximate the function of emitters 24A and 24B in the apparatus of FIG. 1 and in the optical arrangement of FIG. 4, while providing less slow-axis divergence at the same power, or greater power for the same slow-axis divergence. By way of example it is estimated that a cluster of five sub-emitters 86 having cluster width D of 300 $\mu$m, a sub-emitter $D_S$ of 50 $\mu$m at a fill-factor of 83% can provide 20% less divergence than an individual emitter 24 delivering the same power.

Depending on the skill of the practitioner, it may be found difficult in practice to achieve the preferred fast-axis alignment of emitters (or clusters of sub-emitters) discussed above. Typically, any significant misalignment will result from assembling a stack of bars, as the spacing S of the emitters can be controlled accurately by the optical lithographic techniques typically used to manufacture diode-laser bars. A description of one arrangement for overcoming less-than-perfect alignment of diode-laser bars 22 in a stack thereof is set forth below with reference to FIG. 7, FIG. 8A and FIG. 8B.

FIG. 7 schematically depicts a stack 57 of two-emitter diode-laser bars 22 of equal length with equal emitter-spacing S. Emitters 24A and 24B of the diode-laser bars are misaligned as a result of misalignment of the diode-laser bars in the stack. Misalignment is exaggerated in FIG. 7, compared with what would be typical in practice, for purposes of illustration. FIGS. 8A and 8B depict one of the diode-laser bars 22 including emitters 24A and 24B, emitting along propagation paths $Z_A$ and $Z_B$ respectively, a cylindrical lens 52 for collimating the fast-axis output of the emitters, and an alignment plate 90 immediately following lens 52 on propagation paths $Z_A$ and $Z_B$. Alignment plate 90 has parallel entrance and exit faces 90A and 90B thereof aligned parallel to the fast-axis (Y-axis). Alignment plate 90 is rotatable about an axis 92, parallel to the fast-axis. If the alignment plate is rotated such that entrance face 90A thereof is inclined at an angle $\theta$ to the slow-axis (X-axis), the beam paths will be displaced in the slow-axis by an amount $\delta$ (see FIG. 8A) dependent on the thickness and refractive index of alignment plate 90. In FIG. 8A, alignment plate 90 is rotated in a clockwise direction as indicated by arrow $R_R$, shifting the beam paths to the right. In FIG. 8B alignment plate 90 is rotated in a counterclockwise direction as indicated by arrow $R_L$, shifting the beam paths to the left.

FIG. 9A and FIG. 9B schematically illustrate an optical arrangement 65 similar to optical arrangement 62 of FIGS. 4A and 4B but wherein the arrangement includes a beam combining apparatus 23 including a stack 57 of misaligned diode-laser bars 22 and correspondingly misaligned emitters 24A and 24B similar to the diode-laser bar stack of FIG. 7. Each diode-laser bar is provided with a cylindrical-lens 52 for collimating the fast axis output of emitters 24A and 24B thereof. Each diode-laser bar is also provided with an alignment plate 90 as depicted in FIGS. 8A and 8B. The alignment plates are adjusted as described above such that beams 74A and 74B from emitters 24A and 24B respectively, and, correspondingly, combined beams 74 are aligned one above the other in the fast-axis direction.

In the description of the present invention given above preferred diode-laser bars include only two spaced-apart broad-aperture emitters, or two spaced-apart clusters of narrower-aperture emitters approximating the function of the broad-area emitters. Those skilled in the art will recognize from the description that principles of the invention are applicable to diode-laser bars including four or more spaced apart emitters or equivalent clusters thereof.

By way of example, FIGS. 10A and 10B schematically depict an optical arrangement 69 in accordance with the present invention, similar to optical arrangement 62 of FIGS. 4A and 4C but wherein two emitter bars 22 of arrangement 62 are replaced by a stack 96 of ten four-emitter bars 98. Diode-laser bars 98 include equally-spaced apart emitters 25A, 25B, 25C, and 25D emitting beams 75A, 75B, 75C and 75D respectively. Beams 75C and 77D are polarization-rotated by polarization-rotating device 54. The polarization-rotated beams are combined by composite prism 30 with beams 75A and 75C, as discussed above with reference to optical arrangement 62. Two combined beams 75 and 77, bounded by rays 79 and 81 respectively are formed by composite prism 30 for each of the diode-laser bars, thereby providing forty combined beams. Twenty beams 75 and twenty beams 77 are aligned in the fast-axis direction on opposite sides of system optical axis 63, at an equal distance therefrom in the slow-axis direction. The combined beams are focused in the fast and slow axes into entrance face 64A of optical fiber 64 by lenses 66 and 68 respectively.

It should be noted that, for a fixed diode-laser bar length, as the number of emitters in a diode-laser bar is increased, the spacing decreases correspondingly. Slow-axis beam quality of the diode-laser bar is not changed significantly, as any improvement due to reduction in emitter-spacing is offset by the increase in the number of emitters. In general, when beams from one-half of a plurality of (four or more) emitters are combined with beams from the other half of the plurality of emitters, slow-axis beam quality will be improved by only about a factor of two, rather than the factor of ten or more that is possible by combining beams from two-emitter bars in accordance with the present invention.

A problem of increasing the number of emitters in a diode-laser bar to four or more is that a point may be reached when some portion of the beams from centrally-located ones of the emitters will not enter the appropriate entry faces of composite prism 30 due to slow-axis divergence. Accordingly, total power in the combined beams will be correspondingly reduced. This problem may be mitigated to some extent by providing slow axis microlenses to reduce slow axis divergence of the beams before they reach composite prism 30. In optical arrangement 69 of FIGS. 10A and 10B, an array 100 of slow-axis cylindrical microlenses 102 is located between fast-axis collimating lenses 52 and composite prism 30.

Another potential problem of increasing the number of emitters per diode-laser bar is that, as the number of emitters per bar is increased, cooling of the bar may become more difficult and may require that fast-axis spacing V in a stack of the diode-laser bars be increased, thereby reducing fast-axis beam quality. Yet another potential problem is achieving a suitable alignment of fast-axis collimating lens 52 with the multiple emitters due to the above-discussed "smile" misalignment of the emitters. This problem however is significantly less than would be encountered in attempting to align beams from separate diode-laser bars.

Embodiments of the present invention are described above with reference to combining beams from emitters of a diode-laser bar that emit plane-polarized radiation having a polarization orientation parallel to the fast axis of the emitters. This is a feature of emitters formed from strained semiconductor layers. In emitters having layers with minimal strain the polarization orientation of emitted radiation may align in parallel to the slow axis of the emitters. The beam combining method of the present invention is readily adaptable to combining such fast-axis polarized beams as discussed below with reference to FIG. 11 and FIG. 12.

Figure 11:
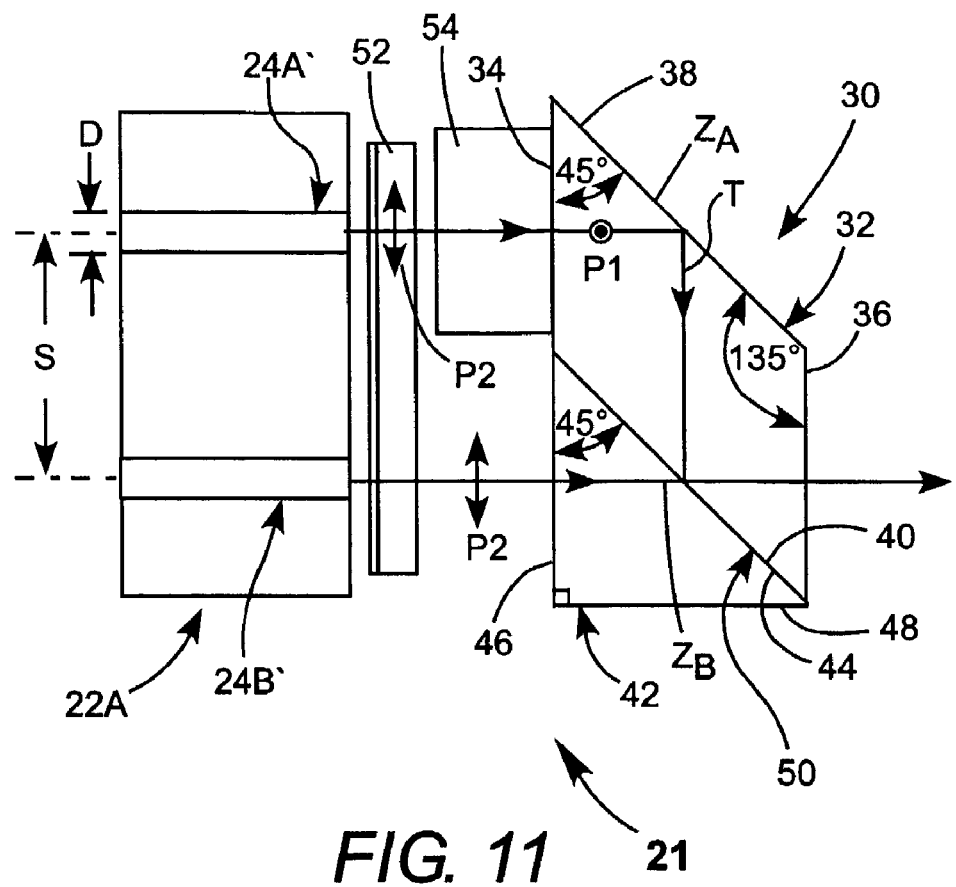
FIG. 11 is a plan view schematically illustrating a preferred embodiment of diode-laser radiation beam combining apparatus in accordance with the present invention including a two-emitter diode-laser bar emitting laser radiation plane-polarized parallel to the slow axis of the diode laser bar, and an optical arrangement including a polarization rotator and a composite prism for combining laser-radiation beams from the two emitters.
Figure 12:
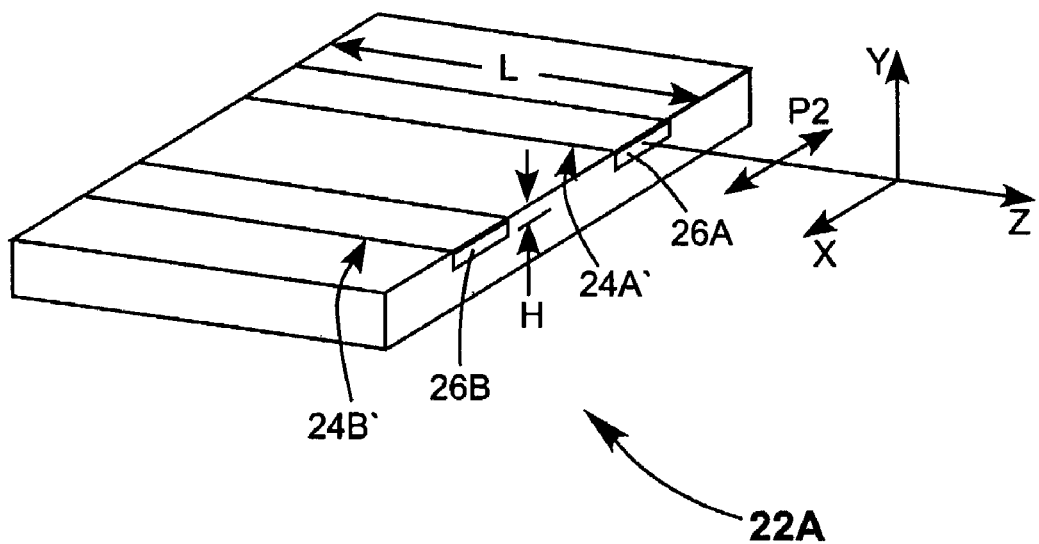
FIG. 12 is a three-dimensional view schematically illustrating details of the diode-laser bar and emitters of FIG. 11.

FIG. 11 schematically illustrates an embodiment 21 of beam combining apparatus in accordance with the present invention similar to beam-combining apparatus 20 of FIG. 1 but wherein a diode-laser bar 22A includes emitters 24A' and 24B' emitting laser-radiation plane polarized in orientation P2 parallel to the slow (X) axis of the emitters. Detail of diode-laser bar 22A is depicted in FIG. 12. Here, the polarization plane of the emitted laser-radiation in path ZB is transmittable by polarization selective mirror 50. The polarization plane of the laser-radiation in path ZA, however, must be rotated by 90 degrees to orientation P1 in order that it can be reflected from mirror 50. Accordingly, polarization-rotating device 54 is located in path ZA between diode-laser bar 22A and composite prism 30 to effect this polarization rotation. Internal reflection from face 38 of parallelepiped prism 32 is similarly effective for both polarization orientations. Those skilled in the art will recognize without further illustration that beam combining apparatus similar to apparatus 20A may include more than two emitters, clusters of emitters and may be substituted for beam combining apparatus in any above described arrangement for coupling diode-laser radiation into optical fiber 64.

The present invention is described above in terms of a preferred and other embodiments. The invention is not limited, however, to the embodiments described and depicted. Rather, the invention is limited only by the claims appended hereto.

What is claimed is:

1. A method of coupling laser-radiation into an optical fiber, comprising the steps of:
   (i) providing a plurality of diode-laser bars, each of said diode-laser bars including at least first and second spaced-apart diode-laser emitters emitting respectively first and second beams of laser-radiation;
   (ii) optically combining said first and second laser-radiation beams from each of said diode-laser bars to form a plurality of third laser-radiation beams, each of said third laser-radiation beams including co-propagating ones of said first and second laser-radiation beams from a corresponding diode-laser bar; and
   (iii) focusing said third laser-radiation beams into an entrance face of the optical fiber wherein each said of emitters in a said diode-laser bar has an emitting-aperture having a height and a width, said emitted laser-radiation beam being emitted from each emitting-aperture and diverging unequally in fast and slow axes perpendicular to each other and mutually perpendicular to the propagation path of said laser-radiation beams, said fast axis being aligned perpendicular to the width direction of said emitters;

and wherein said third laser-radiation beams are parallel to each other and are aligned in the fast-axis direction.

2. The method of claim 1, further including the step of (iv) prior to step (ii), collimating said emitted laser-radiation beams in the fast-axis.

3. The method of claim 1, wherein there are first, second, third and fourth emitters in each of said diode-laser bars, said third and fourth emitters emitting respectively fourth and fifth laser-radiation beams, wherein step (ii) further includes optically combining said fourth and fifth laser-radiation beams to form a plurality of sixth laser-radiation beams each of said sixth laser-radiation beams including co-propagating ones of said fourth and fifth laser-radiation beams from a corresponding diode-laser bar, and wherein step (iii) further includes focusing said sixth laser-radiation beams into an entrance face of the optical fiber.

4. A method of coupling laser-radiation into an optical fiber, comprising the steps of:
   (i) providing a plurality of diode-laser bars, each of said diode-laser bars including at least first and second spaced-apart diode-laser emitters emitting respectively first and second beams of laser-radiation;
   (ii) optically combining said first and second laser-radiation beams from each of said diode-laser bars to form a plurality of third laser-radiation beams, each of said third laser-radiation beams including co-propagating ones of said first and second laser-radiation beams from a corresponding diode-laser bar; and
   (iii) focusing said third laser-radiation beams into an entrance face of the optical fiber wherein said first and second laser-radiation beams are plane-polarized in a first orientation, and step (ii) includes (a) providing a composite prism including a parallelepiped prism and a triangular prism with a face of said parallelepiped prism optically bonded to a face of said triangular prism, a face of the parallelepiped prism parallel to the bonded face thereof providing a mirror having a high reflectivity for said laser-radiation in said first polarization orientation, one of said bonded faces being optically coated such that said bonded faces provide a second mirror, spaced apart from and parallel to said first mirror, and having a high reflectivity for said laser-radiation in said first polarization orientation and a high transmissivity for said laser-radiation in a second polarization orientation perpendicular to said first polarization orientation; (b) rotating the polarization orientation of said second laser-radiation beam from said first orientation to said second orientation and transmitting said polarization-rotated, second laser-radiation beam through said second mirror; and (c) reflecting said first laser-radiation beam sequentially from said first and second mirrors such that said sequentially-reflected first laser-radiation beam co-propagates with said transmitted, polarization-rotated second laser-radiation beam.

5. The method of claim 4, wherein said parallelepiped prism is a 45°–135° parallelepiped prism and said triangular prism is an isosceles-triangular prism having isosceles faces perpendicular to each other and a hypotenuse face inclined at 45° to the isosceles faces, with said hypotenuse face of said triangular prism being the bonded face thereof.

6. The method of claim 5, wherein said polarization-rotating device is a half-wave plate.

7. A method of coupling laser-radiation into an optical fiber, comprising the steps of:
   (i) providing a plurality of diode-laser bars, each of said diode-laser bars including at least first and second spaced-apart diode-laser emitters emitting respectively first and second beams of laser-radiation;
   (ii) optically combining said first and second laser-radiation beams from each of said diode-laser bars to form a plurality of third laser-radiation beams, each of said third laser-radiation beams including co-propagating ones of said first and second laser-radiation beams from a corresponding diode-laser bar; and
   (iii) focusing said third laser-radiation beams into an entrance face of the optical fiber wherein said first and second laser-radiation beams are plane-polarized in a first orientation, and step (ii) includes (a) providing a composite prism including a parallelepiped prism and a triangular prism with a face of said parallelepiped prism optically bonded to a face of said triangular prism, a face of the parallelepiped prism parallel to the bonded face thereof providing a mirror having a high reflectivity for said laser-radiation in said first polarization orientation, one of said bonded faces being optically coated such that said bonded faces provide a second mirror, spaced apart from and parallel to said first mirror, and having a high reflectivity for said laser-radiation in a second polarization orientation perpendicular to said first polarization orientation and a high transmissivity for said laser-radiation in said first polarization orientation; (b) transmitting said second laser-radiation beam through said second mirror; and (c) rotating the polarization orientation of said first laser-radiation beam from said first orientation to said second orientation and reflecting said polarization-rotated first laser-radiation beam sequentially from said first and second mirrors such that said sequentially-reflected, polarization-rotated first laser-radiation beam co-propagates with said transmitted second laser-radiation beam.

8. The method of claim 7, wherein said parallelepiped prism is a 45°–135° parallelepiped prism and said triangular prism is an isosceles-triangular prism having isosceles faces perpendicular to each other and a hypotenuse face inclined at 45° to the isosceles faces, with said hypotenuse face of said triangular prism being the bonded face thereof.

9. The method of claim 8, wherein said polarization-rotating device is a half-wave plate.

10. A method of coupling laser-radiation into an optical fiber, comprising the steps of:
    (i) providing a plurality N of diode-laser bars where N is an integer greater than zero, each of said diode-laser bars including at least first and second diode-laser emitters emitting respectively first and second beams of laser-radiation from an emitting-aperture having a height and a width, with said apertures aligned in the width direction thereof and spaced apart center-to-center by a distance S, said laser-radiation beams diverging in fast and slow axes perpendicular to each other and mutually perpendicular to the direction of emission with said slow axis being parallel to the width direction of said emitters, and said emitted laser-radiation beams being plane-polarized in a first polarization orientation perpendicular to said slow-axis;
    (ii) arranging said diode-laser bars parallel to each other and one above the other in said fast-axis direction such that emitters in adjacent bars have a fast-axis spacing therebetween;
    (iii) collimating said first and second laser-radiation beams from each of said diode-laser bars;
    (iv) providing first and second mirrors arranged parallel to each other and spaced apart and being inclined to said emission direction of said laser-radiation beams, said first and second mirrors being highly reflective for said laser-radiation polarized in said first orientation and said second mirror being highly transmissive for said laser-radiation polarized in a second orientation perpendicular to said first orientation;
    (v) rotating the polarization plane of each said fast-axis collimated second laser-radiation beams from said first orientation to said second orientation;
    (vi) transmitting said fast-axis collimated, polarization-rotated, second laser-radiation beams through said second mirror and sequentially reflecting each of said collimated first laser-radiation beams from said first and second mirrors such that N combined laser-radiation beams are formed, each of said combined laser-radiation beams including co-propagating ones of said fast-axis collimated first and said fast-axis collimated, polarization-rotated second laser-radiation beams from a corresponding diode-laser bar; and
    (viii) focusing said N combined laser-radiation beams into an entrance face of the optical fiber.

11. The method of claim 10, wherein said combined beams are parallel to each other and aligned in said fast-axis direction.

12. The method of claim 11, wherein said combined-beam alignment is effected by aligning said first and second emitters in each diode-laser bar in the fast-axis direction.

13. The method of claim 11, wherein said combined-beam alignment is effected by optically displacing, in the slow-axis direction, the beam path of one or more of said collimated first and second laser-radiation beams.

14. The method of claim 10, wherein said first and second mirrors are provided by a composite prism including a parallelepiped prism and an isosceles-triangle prism with one face of the parallelepiped prism providing said first mirror and with an opposite face of the parallelepiped prism being bonded to an isosceles face of the triangular prism with one of the bonded prism faces being optically coated to provide said second mirror.

15. The method of claim 14, wherein said parallelepiped prism has corner angles of 45° and 135° and said isosceles-triangle prism has corner angles of 45° and 90°.

16. The method of claim 10, wherein said N combined laser-radiation beams collectively have the same beam quality in the fast-axis and slow-axis directions.

17. A method of coupling laser-radiation into an optical fiber, comprising the steps of:
(i) providing a plurality N of diode-laser bars where N is an integer greater than zero, each of said diode-laser bars including at least first and second diode-laser emitters emitting respectively first and second beams of laser-radiation from an emitting-aperture having a height and a width, with said apertures aligned in the width direction thereof and spaced apart center-to-center by a distance S, said laser-radiation beams diverging in fast and slow axes perpendicular to each other and mutually perpendicular to the direction of emission with said slow axis being parallel to the width direction of said emitters, and said emitted laser-radiation beams being plane-polarized in a first polarization orientation perpendicular to said slow-axis;
(ii) arranging said diode-laser bars parallel to each other and one above the other in said fast-axis direction such that emitters in adjacent bars have a fast-axis spacing therebetween;
(iii) collimating said first and second laser-radiation beams from each of said diode-laser bars;
(iv) providing first and second mirrors arranged parallel to each other and spaced apart and being inclined to said emission direction of said laser-radiation beams, said first and second mirrors being highly reflective for said laser-radiation polarized in said first orientation and said second mirror being highly transmissive for said laser-radiation polarized in a second orientation perpendicular to said first orientation;
(v) rotating the polarization plane of each said fast-axis collimated second laser-radiation beams from said first orientation to said second orientation;
(vi) transmitting said fast-axis collimated first laser-radiation beams through said second mirror and sequentially reflecting each of said collimated, polarization-rotated second laser-radiation beams from said first and second mirrors such that N combined laser-radiation beams are formed, each of said combined laser-radiation beams including co-propagating ones of said fast-axis collimated first and said fast-axis collimated, polarization-rotated second laser-radiation beams from a corresponding diode-laser bar; and
(viii) focusing said N combined laser-radiation beams into an entrance face of the optical fiber.

18. The method of claim 17, wherein said combined beams are parallel to each other and aligned in said fast-axis direction.

19. The method of claim 18, wherein said combined-beam alignment is effected by aligning said first and second emitters in each diode-laser bar in the fast-axis direction.

20. The method of claim 18, wherein said combined-beam alignment is effected by optically displacing, in the slow-axis direction, the beam path of one or more of said collimated first and second laser-radiation beams.

21. The method of claim 17, wherein said first and second mirrors are provided by a composite prism including a parallelepiped prism and an isosceles-triangle prism with one face of the parallelepiped prism providing said first mirror and with an opposite face of the parallelepiped prism being bonded to an isosceles face of the triangular prism with one of the bonded prism faces being optically coated to provide said second mirror.

22. Optical apparatus comprising:
a diode-laser array including first and second emitters, each thereof having a height and a width, said emitters being spaced apart in the width direction and arranged to emit laser-radiation in first and second beams thereof, said laser-radiation beams propagating parallel to each other in a direction generally along a propagation direction, and each of said first and second laser-radiation beams diverging in fast and slow axes, said fast axis, said slow axis, and said propagation direction being mutually perpendicular, said slow axis being parallel to the width direction of said emitters, and each of said laser-radiation beams being plane-polarized in a first orientation perpendicular to said slow axis;
a cylindrical lens in front of said diode-laser array arranged to collimate said first and second laser-radiation beams in said fast axis thereof;
first and second mirrors inclined to said propagation axis and parallel to each other, each thereof being highly reflective for said laser-radiation plane-polarized in said first orientation, and said second mirror being highly transmissive for said laser-radiation plane-polarized in a second orientation perpendicular to said first orientation;
a polarization-rotating device arranged to rotate the polarization orientation of said fast-axis collimated second laser-radiation beam from said first orientation to said second orientation;
said first and second mirrors and said polarization rotating device being arranged such that said fast-axis collimated, polarization-rotated second laser-radiation beam is transmitted through said second mirror and said fast-axis collimated, first laser-radiation beam is reflected sequentially by said first and second mirrors such that said sequentially-reflected fast-axis collimated, first laser-radiation beam and said transmitted, fast-axis collimated, polarization-rotated second laser-radiation beam are combined and propagate in the same direction.

23. The apparatus of claim 22, wherein said first and second mirrors are incorporated in a composite prism, said composite prism including a parallelepiped prism and an isosceles-triangle prism with one face of said parallelepiped prism providing said first mirror and with an opposite face of said parallelepiped prism being bonded to an isosceles face of the triangular prism, with one of the bonded prism faces being optically coated, thereby providing said second mirror.

24. Optical apparatus comprising:
a diode-laser array including first and second emitters, each thereof having a height and a width, said emitters being spaced apart in the width direction and arranged to emit laser-radiation in first and second beams thereof, said laser-radiation beams propagating parallel to each other in a direction generally along a propagation direction, and each of said first and second laser-radiation beams diverging in fast and slow axes, said fast axis, said slow axis, and said propagation direction being mutually perpendicular, said slow axis being parallel to the width direction of said emitters, and each of said laser-radiation beams being plane-polarized in a first orientation parallel to said slow axis;

a cylindrical lens in front of said diode-laser array arranged to collimate said first and second laser-radiation beams in said fast axis thereof;

first and second mirrors inclined to said propagation axis and parallel to each other, each thereof being highly reflective for said laser-radiation plane-polarized in a second orientation perpendicular to said first orientation, and said second mirror being highly transmissive for said laser-radiation plane-polarized in said first orientation;

a polarization-rotating device arranged to rotate the polarization orientation of said fast-axis collimated second laser-radiation beam from said first orientation to said second orientation;

said first and second mirrors and said polarization rotating device being arranged such that said fast-axis collimated first laser-radiation beam is transmitted through said second mirror, and said fast-axis collimated, polarization-rotated second laser-radiation beam is reflected sequentially by said first and second mirrors such that said transmitted, fast-axis collimated first laser-radiation beam and said sequentially-reflected fast-axis collimated, polarization-rotated second laser-radiation beam are combined and propagate in the same direction.

25. The apparatus of 24, wherein said first and second mirrors are incorporated in a composite prism, said composite prism including a parallelepiped prism and an isosceles-triangle prism with one face of said parallelepiped prism providing said first mirror and with an opposite face of said parallelepiped prism being bonded to an isosceles face of the triangular prism, with one of the bonded prism faces being optically coated, thereby providing said second mirror.

26. Optical apparatus comprising:
a number N of elongated diode-laser bars where N is an integer greater than zero, each thereof including first and second emitters each of said emitters having a height and a width, said emitters being spaced apart in the width direction and arranged to emit laser-radiation in first and second beams thereof, said laser-radiation beams propagating parallel to each other in a direction generally along a propagation direction, and each of said first and second laser-radiation beams diverging in fast and slow axes, said fast axis, said slow axis, and said propagation direction being mutually perpendicular, said slow axis being parallel to the width direction of said emitters, each of said laser-radiation beams being plane-polarized in a first orientation perpendicular to said slow axis, and said diode-laser bars arranged spaced apart and parallel, one above the other in the fast-axis direction;

a number N of cylindrical lenses, one located in front of each diode-laser bar and arranged to collimate said first and second laser-radiation beams in said fast axis thereof;

first and second mirrors inclined to said propagation axis and parallel to each other, each thereof being highly reflective for the laser-radiation plane-polarized in said first orientation, and said second mirror being highly transmissive for radiation plane-polarized in a second orientation perpendicular to said first orientation;

a polarization rotating device arranged to rotate the polarization orientation of said fast-axis collimated second laser-radiation beams from said first orientation to said second orientation;

said first and second mirrors and said polarization rotating device being arranged such that said fast-axis collimated, polarization-rotated second laser-radiation beams are transmitted through said second mirror, and said fast-axis collimated, first laser-radiation beams are reflected sequentially by said first and second mirrors such that corresponding ones of said sequentially-reflected fast-axis collimated, first laser-radiation beams and said transmitted, fast-axis collimated, polarization-rotated second laser-radiation beams are combined and propagate in the same direction as N combined beams.

27. The apparatus of 26, wherein said N combined beams are parallel to each other and aligned one above the other in the fast-axis direction.

28. The apparatus of 26, wherein said first and second mirrors are incorporated in a composite prism, said composite prism including a parallelepiped prism and an isosceles-triangle prism with one face of the parallelepiped prism providing said first mirror and with an opposite face of the parallelepiped prism being bonded to an isosceles face of the triangular prism, with one of the bonded prism faces being optically coated, thereby providing said second mirror.

29. The apparatus of 26, further including an optical fiber and an arrangement of cylindrical lenses for focusing said N combined beams into an entrance face of said optical fiber.

30. The apparatus of claim 29, wherein said optical fiber is doped to provide a laser gain-medium excitable by the laser-radiation.

31. Optical apparatus comprising:
a number N of elongated diode-laser bars where N is an integer greater than zero, each thereof including first and second emitters each of said emitters having a height and a width, said emitters being spaced apart in the width direction and arranged to emit laser-radiation in first and second beams thereof, said laser-radiation beams propagating parallel to each other in a direction generally along a propagation direction, and each of said first and second laser-radiation beams diverging in fast and slow axes, said fast axis, said slow axis, and said propagation direction being mutually perpendicular, said slow axis being parallel to the width direction of said emitters, each of said laser-radiation beams being plane-polarized in a first orientation parallel to said slow axis, and said diode-laser bars arranged spaced apart and parallel, one above the other in the fast-axis direction;

a number N of cylindrical lenses, one located in front of each diode-laser bar and arranged to collimate said first and second laser-radiation beams in said fast axis thereof;

first and second mirrors inclined to said propagation axis and parallel to each other, each thereof being highly reflective for the laser-radiation plane-polarized in a said second orientation perpendicular to said first orientation, and said second mirror being highly transmissive for radiation plane-polarized in said first orientation;

a polarization rotating device arranged to rotate the polarization orientation of said fast-axis collimated second laser-radiation beams from said first orientation to said second orientation;

said first and second mirrors and said polarization rotating device being arranged such that said fast-axis collimated first laser-radiation beams are transmitted through said second mirror, and said fast-axis collimated, polarization-rotated second laser-radiation beams are reflected sequentially by said first and second mirrors such that corresponding ones of said fast-axis collimated, transmitted first laser-radiation beams and said fast-axis collimated, polarization-rotated, sequentially-reflected second laser-radiation beams are combined and propagate in the same direction as N combined beams.

32. The apparatus of 31, wherein said N combined beams are parallel to each other and aligned one above the other in the fast-axis direction.

33. The apparatus of 31, wherein said first and second mirrors are incorporated in a composite prism, said composite prism including a parallelepiped prism and an isosceles-triangle prism with one face of the parallelepiped prism providing said first mirror and with an opposite face of the parallelepiped prism being bonded to an isosceles face of the triangular prism, with one of the bonded prism faces being optically coated, thereby providing said second mirror.

34. The apparatus of 31, further including an optical fiber and an arrangement of cylindrical lenses for focusing said N combined beams into an entrance face of said optical fiber.

35. The apparatus of claim 34, wherein said optical fiber is doped to provide a laser gain-medium excitable by the laser-radiation.

36. Optical apparatus, comprising:
a number N of elongated diode-laser bars where N is an integer greater than zero, each thereof including first and second emitters, each of said emitters having a height and a width, said emitters being spaced apart in the width direction and arranged to emit laser-radiation in first and second beams thereof, said laser-radiation beams propagating parallel to each other in a direction generally along a propagation direction, and each of said first and second laser-radiation beams diverging in fast and slow axes, said fast axis, said slow axis, and said propagation direction being mutually perpendicular, said slow axis being parallel to the width direction of said emitters, each of said laser-radiation beams being plane-polarized in a first orientation perpendicular to said slow axis, and said diode-laser bars arranged spaced apart and parallel, one above the other in the fast-axis direction;
a number N of cylindrical lenses, one located in front of each diode-laser bar and arranged to collimate said first and second laser-radiation beams in said fast axis thereof;
a number N of alignment plates, one in front of each diode-laser bar, each thereof being selectively rotatable about the fast axis direction for displacing the beam-path of said collimated first and second laser-radiation beams in the slow axis direction;
first and second mirrors inclined to said propagation axis and parallel to each other, each thereof being highly reflective for the laser-radiation plane-polarized in said first orientation, and said second mirror being highly transmissive for radiation plane-polarized in a second orientation perpendicular to said first orientation, said first and second mirrors being incorporated in a composite prism, said composite prism including a parallelepiped prism and an isosceles-triangle prism with one face of the parallelepiped prism providing said first mirror and with an opposite face of the parallelepiped prism being bonded to an isosceles face of the triangular prism, with one of the bonded prism faces being optically coated, thereby providing said second mirror;
a polarization-rotating device arranged to rotate the polarization orientation of said fast-axis collimated second laser-radiation beams from said first orientation to said second orientation; and
said first and second mirrors and said polarization-rotating device being arranged such that said fast-axis collimated, polarization-rotated second laser-radiation beams are transmitted through said second mirror, and said fast-axis collimated, first laser-radiation beams are reflected sequentially by said first and second mirrors such that corresponding ones of said sequentially-reflected, fast-axis collimated, first laser-radiation beams and said transmitted, fast-axis collimated, polarization-rotated second laser-radiation beams are combined to form N combined beams propagating parallel to each other, one or more of said alignment plates being selectively rotated such that said combined beams are aligned one-above the other in the fast-axis direction.

37. The apparatus of claim 36, further including an optical fiber and an arrangement of cylindrical lenses for focusing said N combined beams into an entrance face of said optical fiber.

38. The apparatus of claim 36, wherein said optical fiber is doped to provide a laser gain-medium excitable by the laser-radiation.

39. Optical apparatus comprising:
a number N of elongated diode-laser bars where N is an integer greater than zero, each thereof including first and second emitters each of said emitters having a height and a width, said emitters being spaced apart in the width direction and arranged to emit laser-radiation in first and second beams thereof, said laser-radiation beams propagating parallel to each other in a direction generally along a propagation direction, and each of said first and second laser-radiation beams diverging in fast and slow axes, said fast axis, said slow axis, and said propagation direction being mutually perpendicular, said slow axis being parallel to the width direction of said emitters, each of said laser-radiation beams being plane-polarized in a first orientation perpendicular to said slow axis, and said diode-laser bars arranged spaced apart and parallel, one above the other with corresponding emitters thereof aligned one above the other in the fast-axis direction;
a number N of cylindrical lenses, one located in front of each diode-laser bar and arranged to collimate said first and second laser-radiation beams in said fast axis thereof;
first and second mirrors inclined to said propagation axis and parallel to each other, each thereof being highly reflective for the laser-radiation plane-polarized in said first orientation, and said second mirror being highly transmissive for radiation plane-polarized in a second orientation perpendicular to said first orientation;
a polarization rotating device arranged to rotate the polarization orientation of said fast-axis collimated second laser-radiation beams from said first orientation to said second orientation;
said first and second mirrors and said polarization rotating device being arranged such that said fast-axis collimated, polarization-rotated second laser-radiation beams are transmitted through said second mirror, and said fast-axis collimated, first laser-radiation beams are reflected sequentially by said first and second mirrors such that corresponding ones of said sequentially-reflected, fast-axis collimated, first laser-radiation beams and said transmitted, fast-axis collimated, polarization-rotated second laser-radiation beams are combined and propagate in the same direction as N combined beams propagating parallel to each other and aligned one above the other in the fast axis direction.

40. The apparatus of claim 39, further including an optical fiber and an arrangement of cylindrical lenses for focusing said N combined beams into an entrance face of said optical fiber.

41. The apparatus of claim 40, wherein said optical fiber is doped to provide a laser gain-medium excitable by the laser-radiation.

42. Optical apparatus comprising:
a diode-laser bar including first and second clusters of spaced apart emitters each emitter having a width and each cluster having a width, said clusters of emitters being spaced apart center-to-center in the width direction by at least two cluster widths, and said emitters in said clusters thereof being spaced apart by less than two emitter widths, said first and second clusters of emitters arranged to emit laser-radiation in respectively first and second beams thereof, said laser-radiation beams propagating parallel to each other in a direction generally along a propagation direction, and each of said first and second laser-radiation beams diverging in fast and slow axes, said fast axis, said slow axis, and said propagation direction being mutually perpendicular, said slow axis being parallel to the width direction of said emitters, and each of said laser-radiation beams being plane-polarized in a first orientation perpendicular to said slow axis;
a cylindrical lens in front of said diode-laser bar arranged to collimate said first and second laser-radiation beams in said fast axis thereof;
first and second mirrors inclined to said propagation axis and parallel to each other, each thereof being highly reflective for the laser-radiation plane-polarized in said first orientation, and said second mirror being highly transmissive for radiation plane-polarized in a second orientation perpendicular to said first orientation;
a polarization-rotating device arranged to rotate the polarization orientation of said fast-axis collimated second laser-radiation beam from said first orientation to said second orientation;
said first and second mirrors and said polarization-rotating device being arranged such that said fast-axis collimated, polarization-rotated second laser-radiation beam is transmitted through said second mirror and said fast-axis collimated, first laser-radiation beam is reflected sequentially by said first and second mirrors such that said sequentially-reflected, fast-axis collimated, first laser-radiation beam and said transmitted, fast-axis collimated, polarization-rotated second laser-radiation beam are combined and propagate in the same direction.

43. The apparatus of claim 42, wherein said first and second mirrors are incorporated in a composite prism, said composite prism including a parallelepiped prism and an isosceles-triangle prism with one face of the parallelepiped prism providing said first mirror and with an opposite face of the parallelepiped prism being bonded to an isosceles face of the triangular prism, with one of the bonded prism faces being optically coated, thereby providing said second mirror.

44. Optical apparatus comprising:
a diode-laser bar including first and second clusters of spaced apart emitters each emitter having a width and each cluster having a width, said clusters of emitters being spaced apart center-to-center in the width direction by at least two cluster widths, and said emitters in said clusters thereof being spaced apart by less than two emitter widths, said first and second clusters of emitters arranged to emit laser-radiation in respectively first and second beams thereof, said laser-radiation beams propagating parallel to each other in a direction generally along a propagation direction, and each of said first and second laser-radiation beams diverging in fast and slow axes, said fast axis, said slow axis, and said propagation direction being mutually perpendicular, said slow axis being parallel to the width direction of said emitters, and each of said laser-radiation beams being plane-polarized in a first orientation parallel to said slow axis;
a cylindrical lens in front of said diode-laser bar arranged to collimate said first and second laser-radiation beams in said fast axis thereof;
first and second mirrors inclined to said propagation axis and parallel to each other, each thereof being highly reflective for the laser-radiation plane-polarized in a second orientation perpendicular to said first orientation, and said second mirror being highly transmissive for radiation plane-polarized in said first orientation;
a polarization-rotating device arranged to rotate the polarization orientation of said fast-axis collimated second laser-radiation beam from said first orientation to said second orientation;
said first and second mirrors and said polarization-rotating device being arranged such that said fast-axis collimated first laser-radiation beam is transmitted through said second mirror and said fast-axis collimated, polarization-rotated second laser-radiation beam is reflected sequentially by said first and second mirrors such that said fast-axis collimated, first laser-radiation beam and said transmitted, fast-axis collimated, polarization-rotated, sequentially-reflected second laser-radiation beam are combined and propagate in the same direction.

45. The apparatus of claim 44, wherein said first and second mirrors are incorporated in a composite prism, said composite prism including a parallelepiped prism and an isosceles-triangle prism with one face of the parallelepiped prism providing said first mirror and with an opposite face of the parallelepiped prism being bonded to an isosceles face of the triangular prism, with one of the bonded prism faces being optically coated, thereby providing said second mirror.

46. A method of coupling laser-radiation into an optical fiber, comprising the steps of:
(i) providing a plurality of diode-laser bars, each of said diode-laser bars including at least first and second spaced-apart diode-laser emitters emitting respectively first and second beams of laser-radiation;
(ii) optically combining said first and second laser-radiation beams from each of said diode-laser bars to form a plurality of third laser-radiation beams, each of said third laser-radiation beams including co-propagating ones of said first and second laser-radiation beams from a corresponding diode-laser bar; and
(iii) focusing said third laser-radiation beams into an entrance face of the optical fiber wherein each of said first and second emitters includes a cluster of spaced-apart sub-emitters, each of said sub-emitters having a sub-emitter width and said clusters of emitters each having a cluster width, and wherein said clusters of emitters are spaced apart by two or more cluster widths, and said sub-emitters are spaced-apart by less than two sub-emitter widths.

47. A method of coupling laser-radiation into an optical fiber, comprising the steps of:
 (i) providing a plurality of diode-laser bars, each of said diode-laser bars including at least first and second spaced-apart diode-laser emitters emitting respectively first and second beams of laser-radiation;
 (ii) optically combining said first and second laser-radiation beams from each of said diode-laser bars to form a plurality of third laser-radiation beams, each of said third laser-radiation beams including co-propagating ones of said first and second laser-radiation beams from a corresponding diode-laser bar; and
 (iii) focusing said third laser-radiation beams into an entrance face of the optical fiber wherein said first and second laser-radiation beams are plane-polarized in a first orientation, and step (ii) includes providing a first mirror having a high reflectivity for said laser-radiation in said first polarization orientation; providing a second mirror spaced apart from and parallel to said first mirror and having a high reflectivity for said laser-radiation in said first polarization orientation and a high transmissivity for said laser-radiation in a second polarization orientation perpendicular to said first polarization orientation; rotating the polarization orientation of said second laser-radiation beam from said first orientation to said second orientation; transmitting said polarization-rotated second laser-radiation beam through said second mirror; and reflecting said first laser-radiation beam sequentially from said first and second mirrors such that said sequentially-reflected first laser-radiation beam co-propagates with said transmitted, polarization-rotated second laser-radiation beam.

48. A method of coupling laser-radiation into an optical fiber, comprising the steps of:
 (i) providing a plurality of diode-laser bars, each of said diode-laser bars including at least first and second spaced-apart diode-laser emitters emitting respectively first and second beams of laser-radiation;
 (ii) optically combining said first and second laser-radiation beams from each of said diode-laser bars to form a plurality of third laser-radiation beams, each of said third laser-radiation beams including co-propagating ones of said first and second laser-radiation beams from a corresponding diode-laser bar; and
 (iii) focusing said third laser-radiation beams into an entrance face of the optical fiber wherein said first and second laser-radiation beams are plane-polarized in a first orientation, and step (ii) includes providing a first mirror having a high reflectivity for said laser-radiation in said first polarization orientation; providing a second mirror spaced apart from and parallel to said first mirror and having a high reflectivity for said laser-radiation in a second polarization orientation perpendicular to said first polarization orientation and a high transmissivity for said laser-radiation in said first polarization orientation; transmitting said second laser-radiation beam through said second mirror; rotating the polarization orientation of said first laser-radiation beam from said first orientation to said second orientation and reflecting said polarization-rotated first laser-radiation beam sequentially from said first and second mirrors such that said sequentially-reflected, polarization-rotated first laser-radiation beam co-propagates with said transmitted second laser-radiation beam.

49. An apparatus for combining the radiation from first and second laser beams each having the same initial polarization state comprising:
 a parallelepiped prism having first and second opposed faces;
 a triangular prism, with said first face of said parallelepiped prism defining a first mirror and with an opposite face of said parallelepiped prism being bonded to a face of the triangular prism, with one of the bonded prism faces being optically coated, thereby defining a second mirror, each mirror being highly reflective for laser radiation in a first polarization state and with said second mirror being highly transmissive for laser radiation in a second polarization state perpendicular to said first polarization state; and
 a polarization-rotating device for rotating the polarization state of one of the laser beams and being aligned in front of either the parallelepiped prism or the triangular prism whereby in use, radiation from one of the laser beams reflects off both the first and second mirrors and radiation from the second laser beam is transmitted through the second mirror.

50. An apparatus as recited in claim 49, wherein said polarization-rotating device is aligned with the triangular prism and said initial polarization state corresponds to said first polarization state.

51. An apparatus as recited in claim 49, wherein said polarization-rotating device is aligned with the parallelepiped prism and said initial polarization state corresponds to said second polarization state.

52. An apparatus for combining the radiation from first and second laser beams each having the same initial polarization state comprising:
 first and second mirrors spaced apart and parallel to each other, each thereof being highly reflective for laser radiation in said initial polarization state and with said second mirror being highly transmissive for laser radiation in a second polarization state perpendicular to said initial polarization state; and
 a polarization-rotating device for rotating the polarization state of a laser beam, said polarization-rotating device being aligned with the second mirror whereby in use radiation from the first laser beam reflects off both the first and second mirrors and the radiation from the second laser beam passes through the polarization rotator and is transmitted through the second mirror.

53. The apparatus of claim 52, wherein said first and second mirrors are incorporated in a composite prism, said composite prism including a parallelepiped prism and a triangular prism with one face of said parallelepiped prism defining said first mirror and with an opposite face of said parallelepiped prism being bonded to a face of the triangular prism, with one of the bonded prism faces being optically coated, thereby defining said second mirror.

54. An apparatus for combining the radiation from first and second laser beams each having the same initial polarization state comprising:
 first and second mirrors spaced apart and parallel to each other, each thereof being highly reflective for said laser radiation having a second polarization state perpendicular to the initial polarization state, and with said second mirror being highly transmissive for said laser radiation in said initial polarization state; and
 a polarization-rotating device for rotating the polarization state of a laser beam, said polarization-rotating device being aligned with the first mirror whereby in use radiation from the first laser beam passes through the polarization rotator and reflects off both the first and second mirrors and the radiation from the second laser beam is transmitted through the second mirror.

55. The apparatus of claim 54, wherein said first and second mirrors are incorporated in a composite prism, said composite prism including a parallelepiped prism and a triangular prism with one face of said parallelepiped prism defining said first mirror and with an opposite face of said parallelepiped prism being bonded to a face of the triangular prism, with one of the bonded prism faces being optically coated, thereby defining said second mirror.

56. An apparatus for combining the radiation from first and second laser beams each having the same initial polarization state comprising:

first and second mirrors spaced apart and parallel to each other, each thereof being highly reflective for laser radiation in a first polarization state and with said second mirror being highly transmissive for laser radiation in a second polarization state perpendicular to said first polarization state; and a polarization-rotating device for rotating the polarization state of one of the laser beams and being positioned such that radiation from said first laser beams reflects off both the first and second mirrors and radiation from said second laser beam is transmitted through the second mirror.

57. The apparatus of claim 56, wherein said first and second mirrors are incorporated in a composite prism, said composite prism including a parallelepiped prism and a triangular prism with one face of said parallelepiped prism defining said first mirror and with an opposite face of said parallelepiped prism being bonded to a face of the triangular prism, with one of the bonded prism faces being optically coated, thereby defining said second mirror.

\* \* \* \* \*